(12) United States Patent
Liaw

(10) Patent No.: US 11,682,450 B2
(45) Date of Patent: Jun. 20, 2023

(54) SRAM PERFORMANCE OPTIMIZATION VIA TRANSISTOR WIDTH AND THRESHOLD VOLTAGE TUNING

(71) Applicant: Taiwan Semiconductor Manufacturing Company, Ltd., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1 day.

(21) Appl. No.: 17/377,175

(22) Filed: Jul. 15, 2021

(65) Prior Publication Data

US 2023/0017584 A1    Jan. 19, 2023

(51) Int. Cl.
| | |
|---|---|
| *G11C 11/412* | (2006.01) |
| *H01L 27/11* | (2006.01) |
| *G11C 11/419* | (2006.01) |

(52) U.S. Cl.
CPC .......... *G11C 11/412* (2013.01); *G11C 11/419* (2013.01); *H01L 27/1104* (2013.01); *H01L 27/1116* (2013.01)

(58) Field of Classification Search
CPC . G11C 11/412; G11C 11/419; H01L 27/1104; H01L 27/1116
USPC .................................................. 365/154, 205
See application file for complete search history.

(56) References Cited

U.S. PATENT DOCUMENTS

| | | | |
|---|---|---|---|
| 8,144,540 B2 | 3/2012 | Liaw | |
| 8,605,523 B2 | 12/2013 | Tao et al. | |
| 8,630,132 B2 | 1/2014 | Cheng et al. | |
| 8,760,948 B2 | 6/2014 | Tao et al. | |
| 9,024,392 B2 | 5/2015 | Liaw | |
| 9,424,385 B1* | 8/2016 | Tien ...................... G06F 30/392 |
| 9,672,903 B2 | 6/2017 | Liaw | |
| 2005/0047196 A1* | 3/2005 | Bhavnagarwala .... G11C 11/412 |
| | | | 365/154 |
| 2007/0063278 A1* | 3/2007 | Doris ...................... H01L 27/11 |
| | | | 257/E27.099 |
| 2007/0195584 A1* | 8/2007 | Imai ...................... G11C 11/412 |
| | | | 365/154 |

(Continued)

FOREIGN PATENT DOCUMENTS

CN            104751877 A    *  7/2015   ........... G11C 11/412

*Primary Examiner* — Michael T Tran
(74) *Attorney, Agent, or Firm* — Haynes and Boone, LLP

(57) ABSTRACT

A read-port of a Static Random Access Memory (SRAM) cell includes a read-port pass-gate (R_PG) transistor and a read-port pull-down (R_PD) transistor. A write-port of the SRAM cell port includes at least a write-port pass-gate (W_PG) transistor, a write-port pull-down (W_PD) transistor, and a write-port pull-up (W_PU) transistor. The R_PG transistor, the R_PD transistor, the W_PG transistor, the W_PD transistor, and the W_PU transistor are gate-all-around (GAA) transistors. The R_PG transistor has a first channel width. The R_PD transistor has a second channel width. The W_PG transistor has a third channel width. The W_PD transistor has a fourth channel width. The W_PU transistor has a fifth channel width. The first channel width and the fourth channel width are each smaller than the second channel width. The third channel width is greater than the fifth channel width.

20 Claims, 16 Drawing Sheets

(56) References Cited

U.S. PATENT DOCUMENTS

| | | | |
|---|---|---|---|
| 2008/0013383 A1* | 1/2008 | Venkatraman | H01L 27/1104 257/E27.099 |
| 2011/0007556 A1* | 1/2011 | Gong | G11C 11/413 365/189.011 |
| 2011/0209109 A1* | 8/2011 | Wang | G06F 30/30 716/106 |
| 2014/0032871 A1 | 1/2014 | Hsu et al. | |
| 2014/0078817 A1* | 3/2014 | Bentum | H01L 27/1104 365/189.11 |
| 2014/0153321 A1 | 6/2014 | Liaw | |
| 2014/0153345 A1 | 6/2014 | Kim et al. | |
| 2014/0153346 A1* | 6/2014 | Roy | G11C 7/12 365/189.15 |
| 2014/0169074 A1* | 6/2014 | Sinha | H01L 27/0207 438/586 |
| 2014/0177352 A1 | 6/2014 | Lum | |
| 2014/0233330 A1 | 8/2014 | Ko et al. | |
| 2014/0241077 A1 | 8/2014 | Katoch et al. | |
| 2014/0269114 A1 | 9/2014 | Yang et al. | |
| 2015/0078103 A1* | 3/2015 | Roy | G11C 7/065 365/189.05 |
| 2017/0148505 A1* | 5/2017 | Kwon | H01L 27/0207 |
| 2019/0206459 A1* | 7/2019 | Lu | G11C 11/412 |
| 2020/0135740 A1* | 4/2020 | Liaw | H01L 27/1104 |
| 2021/0057023 A1* | 2/2021 | Liaw | H01L 29/78696 |
| 2021/0193669 A1* | 6/2021 | Ahmed | H01L 27/1116 |
| 2021/0313320 A1* | 10/2021 | Liaw | H01L 29/6681 |

* cited by examiner

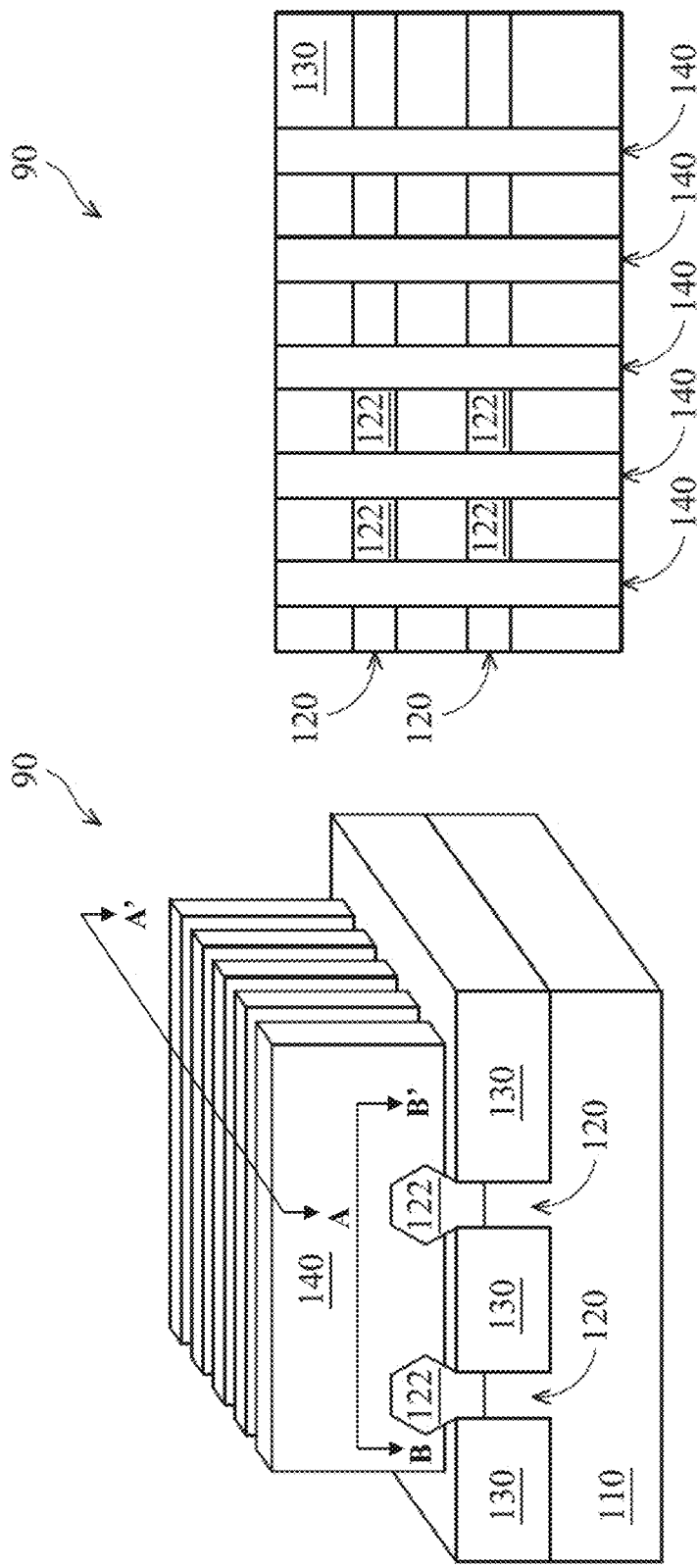

SRAM PERFORMANCE OPTIMIZATION VIA TRANSISTOR WIDTH AND THRESHOLD VOLTAGE TUNING

BACKGROUND

In deep sub-micron integrated circuit technology, an embedded static random access memory (SRAM) device has become a popular storage unit of high speed communication, image processing and system-on-chip (SOC) products. The amount of embedded SRAM in microprocessors and SOCs increases to meet the performance requirement in each new technology generation. As silicon technology continues to scale from one generation to the next, conventional SRAM devices and/or the fabrication thereof may encounter limitations. For example, the read-port and the write-port of SRAM devices (or even different transistors within the same read-port or write-port) may have different concerns and requirements. However, conventional SRAM design has not sufficiently taken these differences into account. As a result, SRAM read performance and/or write performance has not been sufficiently optimized. As another example, SRAM devices have traditionally been fabricated planar devices or FinFET devices. As the device scaling down process continues, planar devices or even FinFET devices may not be able to meet the demands or flexibility requirements of newer generation SRAM devices.

Therefore, although existing SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1A illustrates a three-dimensional perspective view of a FinFET device.

FIG. 1B illustrates a top view of a FinFET device.

DETAILED DESCRIPTION

Figure 1C:
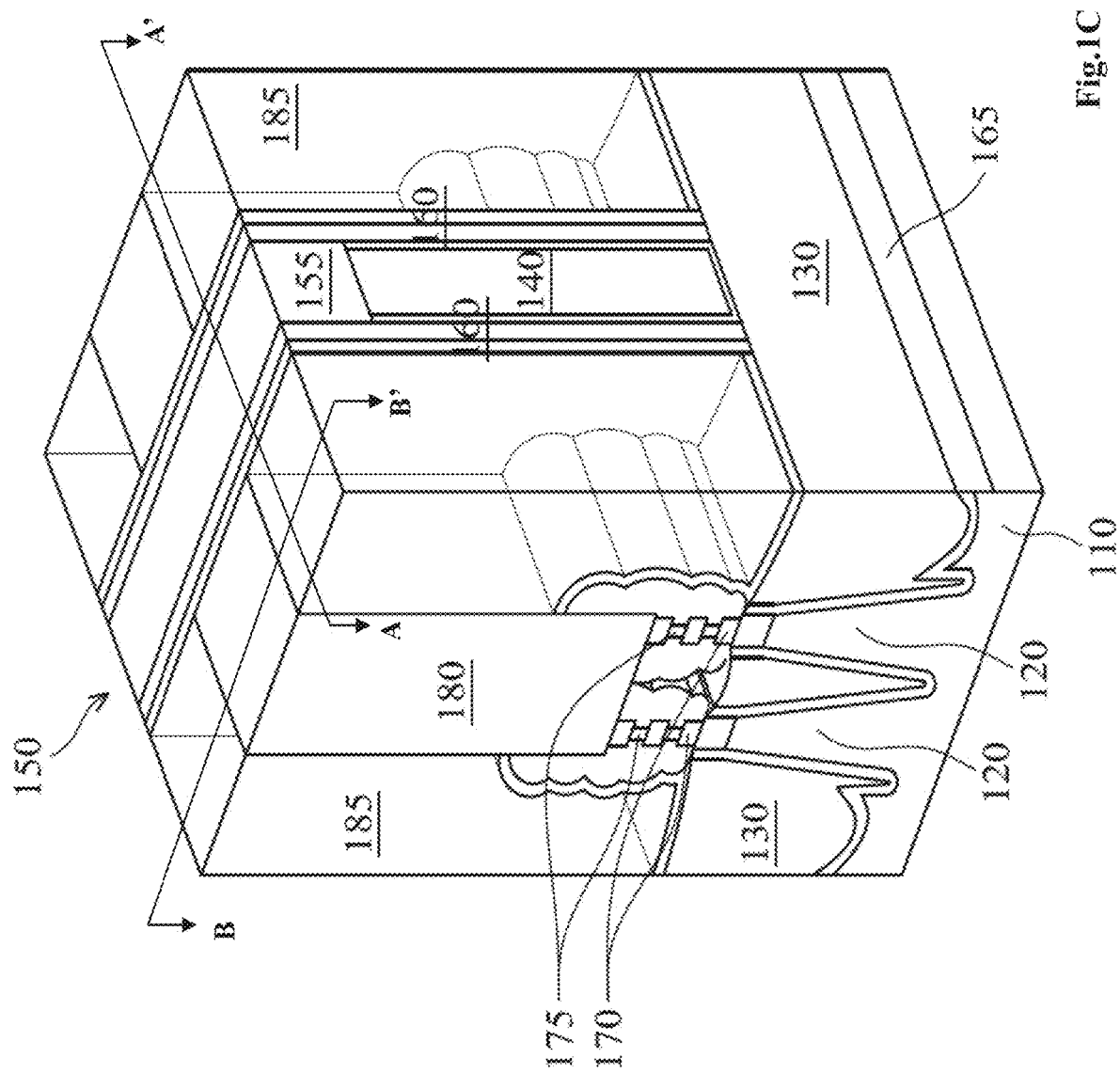
FIG. 1C illustrates a three-dimensional perspective view of a multi-channel gate-all-around (GAA) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to static random-access memory (SRAM) devices, which may be fabricated using semiconductor devices, and more particularly with field-effect transistors (FETs), such as multi-channel gate-all-around (GAA) devices. It is understood that aspects of the present disclosure may also apply to three-dimensional fin-line FETs (FinFETs) or planar FETs. According to various aspects of the present disclosure, SRAM devices have read-ports and write-ports that are separate from one another. Different channel widths and different threshold voltages are also implemented for different transistors. As a result, SRAM device performance is improved, as discussed below in more detail.

FIGS. 1A and 1B illustrate a three-dimensional perspective view and a top view, respectively, of a portion of an Integrated Circuit (IC) device 90, such as an SRAM device, that is implemented using FinFETs. Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. As device sizes continue to shrink, these source/drain features 122 may merge into one another even when they are meant to be kept separate. This is the problem that the present disclosure overcomes, as discussed below in more detail.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

Although FinFETs may be used to implement SRAM devices, FinFETs may run into problems as the SRAM devices are continuously scaled down into ever-smaller sizes. For example, SRAM devices implemented using FinFETs may be more prone to cell mismatch issues, which may adversely affect the stability of SRAM devices. To address the issues related to the FinFET devices, the present disclosure utilizes multi-channel devices such as Gate-All-Around (GAA) transistors to implement the SRAM devices. Compared to FinFETs or planar transistors, GAA transistors allow for more flexible channel scaling as well as lower standby leakage due to better drain-induced-barrier-lowering (DIBL) and swing performance.

FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD)

185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

Figure 2:
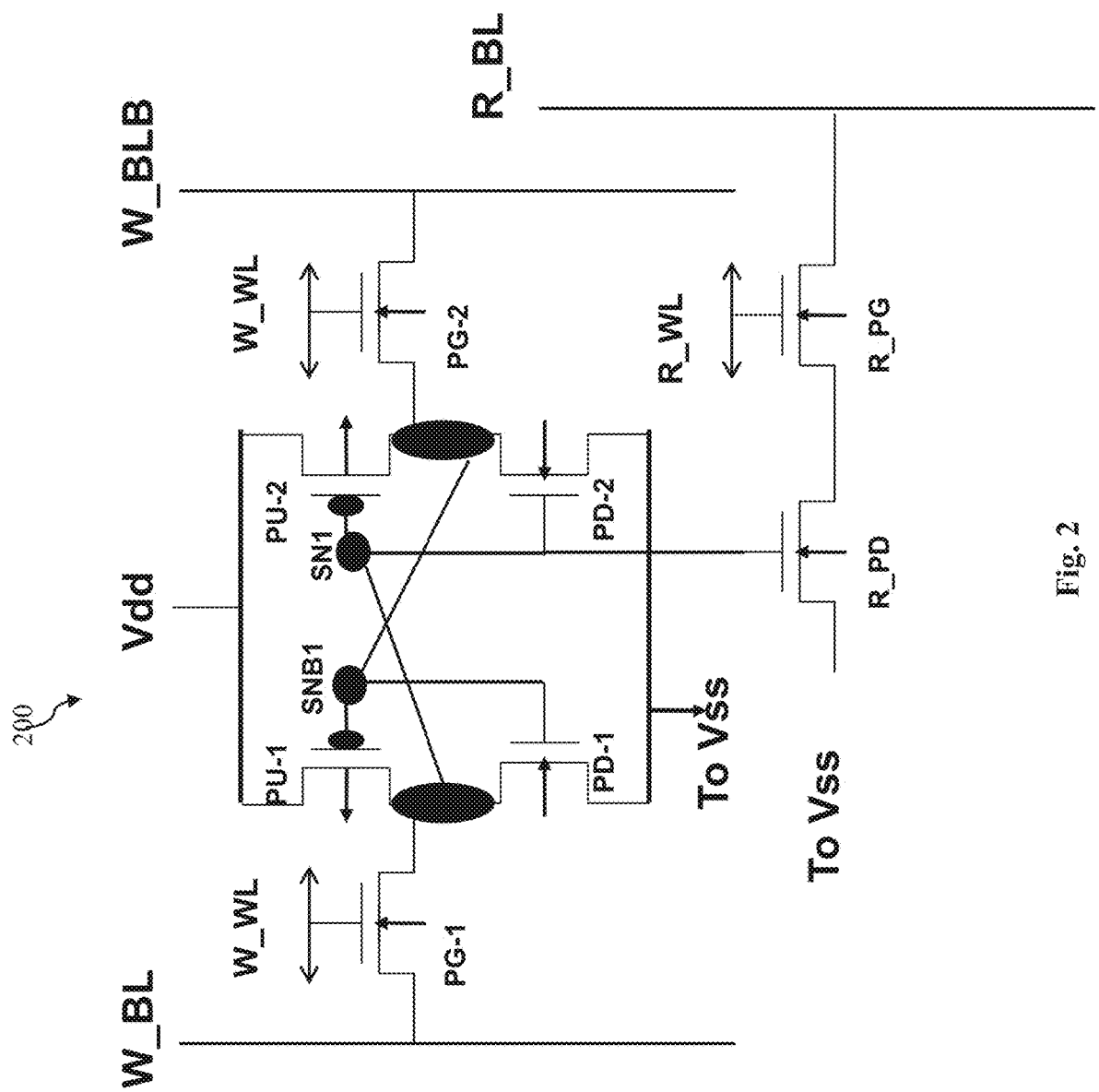
FIG. 2 illustrates a circuit schematic for a two-port SRAM cell according to an embodiment of the present disclosure.

Referring now to FIG. 2, an example circuit schematic for a two-port SRAM cell 200 is shown. The two-port SRAM cell 200 includes a write-port and a read-port. The write-port includes: pull-up transistors PU-1, PU-2; pull-down transistors PD-1, PD-2; and pass-gate transistors PG-1, PG-2. In the illustrated embodiment, transistors PU-1 and PU-2 are p-type transistors, and transistors PG-1, PG-2, PD-1, and PD-2 are n-type transistors.

The drains of pull-up transistor PU-1 and pull-down transistor PD-1 are coupled together, and the drains of pull-up transistor PU-2 and pull-down transistor PD-2 are coupled together. Transistors PU-1 and PD-1 are cross-coupled with transistors PU-2 and PD-2 to form a first data latch. The gates of transistors PU-2 and PD-2 are coupled together and to the drains of transistors PU-1 and PD-1 to form a first storage node SN1, and the gates of transistors PU-1 and PD-1 are coupled together and to the drains of transistors PU-2 and PD-2 to form a complementary first storage node SNB1. Sources of the pull-up transistors PU-1 and PU-2 are coupled to power voltage Vdd (also referred to as Vcc), and the sources of the pull-down transistors PD-1 and PD-2 are coupled to a voltage Vss, which may be an electrical ground in some embodiments.

The first storage node SN1 of the first data latch is coupled to bit line W_BL of the write-port through the pass-gate transistor PG-1, and the complementary first storage node SNB1 is coupled to complementary bit line W_BLB of the write-port through the pass-gate transistor PG-2. The first storage node SN1 and the complementary first storage node SNB1 are complementary nodes that are often at opposite logic levels (logic high or logic low). Gates of pass-gate transistors PG-1 and PG-2 are coupled to a word line W_WL of the write-port.

The read-port of the SRAM cell 200 includes a read-port pass-gate transistor (R_PG) and a read-port pull-down transistor (R_PD). The gate of the read-port pass-gate transistor R_PG is coupled to a word line R_WL of the read-port. The gate of the read-port pull-down transistor R_PD is coupled to the first storage node SN1 (or to the gates of the transistors PU-2 or PD-2). The read-port transistors R_PG and R_PD are coupled between the bit line R_BL of the read-port and Vss.

According to the various aspects of the present disclosure, the transistor R_PD is implemented to have a wider channel width than the transistor R_PG and all the transistors of the write-port. Even within the write-port, the transistor PU-1 and PU-2 are implemented to have thinner channel widths than the transistors PD-1, PD-2, PG-1, and PG-2. In some embodiments, the transistors R-PD, PD-2, and PU-2 may share a continuous gate structure, but they are implemented with different work function metals for their respective gate electrodes, and/or with different gate dielectrics (e.g., doped v.s. non-doped gate dielectric). As will be discussed in more detail below, these configurations help to optimize the performance of the two-port SRAM cell 200.

Figure 3:
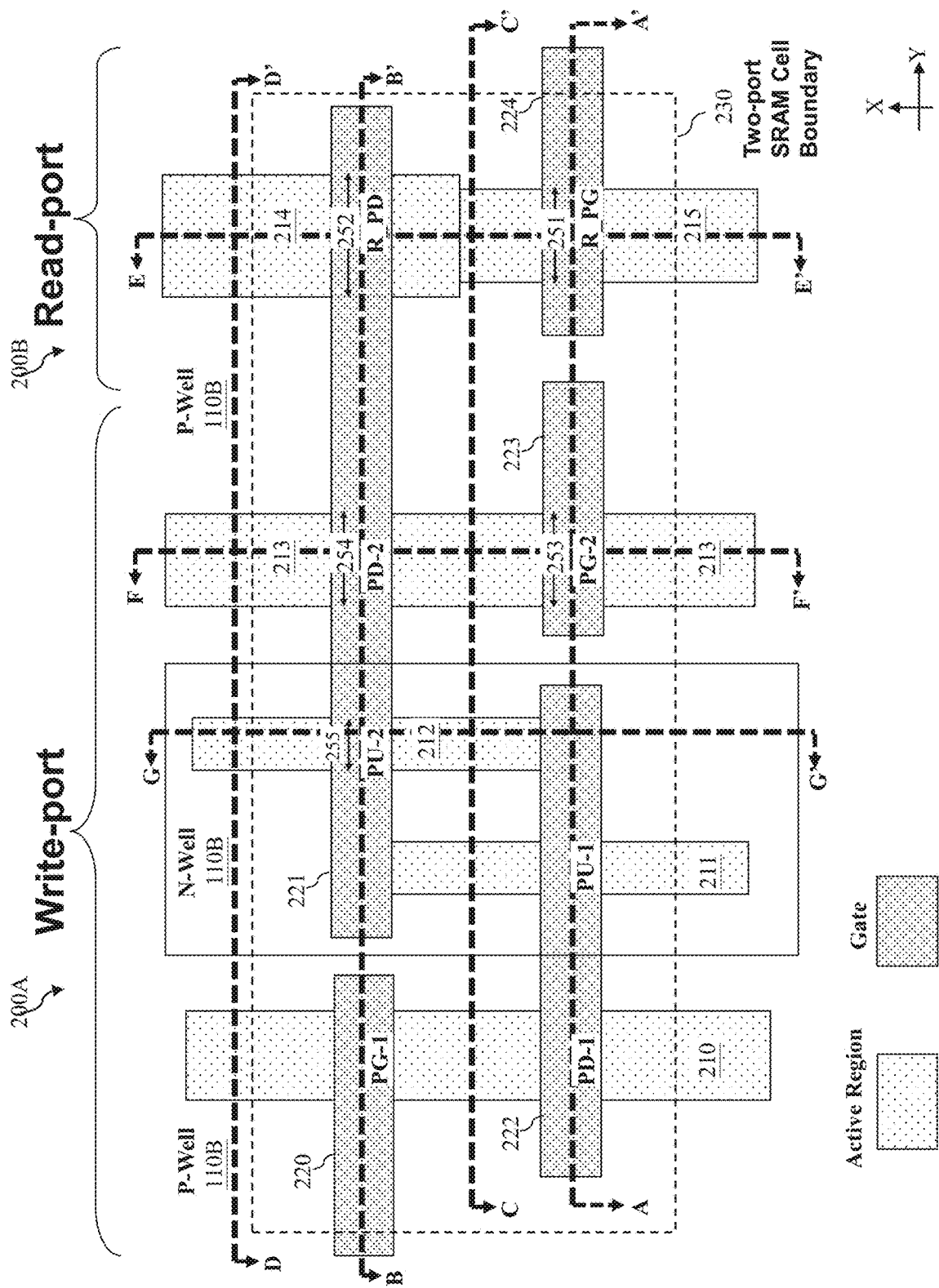
FIGS. 3-4 illustrate top views of a two-port SRAM cell according to an embodiment of the present disclosure.

FIG. 3 illustrates a simplified diagrammatic top view of the two-port SRAM cell 200, which is comprised of a write-port 200A and a read-port 200B. The write-port 200A includes the transistors PG-1, PG-2, PU-1, PU-2, PD-1, and PD-2. The read-port 200B includes the transistors R_PD and R_PG. For reasons of visual clarity and simplicity, the active regions and the gate structures of these transistors are shown in FIG. 3, but the interconnection components such as contacts, vias, and metal lines are omitted from FIG. 3.

As shown in FIG. 3, the two-port SRAM cell 200 includes active regions 210, 211, 212, 213, 214, and 215. The active regions 210-215 each extend in the X-direction (the vertical direction) in FIG. 3. In the illustrated embodiment, the active regions 210-215 may each include (or may be implemented as) the nano-structures 170 of FIG. 1C discussed above. In other embodiments, the active regions 210-215 may include the fin structures 120 of FIGS. 1A-1C as well. The active regions 210-213 are components of the write-port 200A, and the active regions 214-215 are components of the read-port 200B. In the illustrated embodiment, the active regions 211-212 belong to the transistors PU-1 and PU-2, respectively, which are PMOS devices. As such, the active regions 211-212 are formed over an N-well 110B. Meanwhile, the active regions 210 and 213-215 belong to the transistors PD-1, PG-1, PG-2, PD-2, R_PG, and R_PD, which are NMOS devices. As such, the active regions 210 and 213-215 are formed over a P-well 110A (or a P-type substrate). Note that the active regions 214 and 215 are bordering each other (or share a border with each other).

As shown in FIG. 3, the two-port SRAM cell 200 further includes gate structures 220, 221, 222, 223, and 224. The gate structures 220-224 each extend in the Y-direction (the horizontal direction) in FIG. 3. The gate structures 220-224 may each include (or may be implemented as) the gate structures 140 of FIG. 1C discussed above, for example HKMG structures. The gate structures 220, 222, and 223 are components of the write-port 200A. The gate structure 224 is a component of the read-port 200B. The gate structure 221 extends through both the write-port 200A and the read-port 200B. As such, a portion of the gate structure 221 is a component of the write-port 200A, and another portion of the gate structure 221 is a component of the read-port 200B. As will be discussed in further detail below, the gate structure 221 is shared by the transistor R_PD of the read-port 200B and the transistors PU-2 and PD-2 of the write-port 200A.

A boundary 230 of the two-port SRAM cell 200 is illustrated in FIG. 3 using broken lines. Note that some of the active regions and gate structures may extend beyond the illustrated boundary 230, since these active regions and gate structures may also form components of other adjacently located SRAM cells as well. The boundary 230 is longer in the Y-direction than in the X-direction, for example about 3.5 times to about 6 times longer. In other words, the boundary 230 may be rectangular.

According to various aspects of the present disclosure, different active regions in different transistors of the SRAM cell 200 may have different widths (e.g., dimensions measured in the Y-direction) in order to optimize device performance. In more detail, the active region 215 of the R_PG transistor has a width 251, the active region 214 of the R_PD transistor has a width 252, the active region 213 of the PG-2 transistor has a width 253, the active region 213 of the PD-2 transistor has a width 254, and the active region 212 of the PU-2 transistor has a width 255. Although not specifically illustrated for reasons of simplicity, it is understood that the transistors PG-1, PD-1, and PU-1 may have substantially the same widths 253, 254, and 255 as the transistors PG-2, PD-2, and PU-2, respectively.

These widths 251-255 are measured in the portions of the active regions 212-215 underneath the gate structures 221 and 223-224. In other words, these portions of the active regions 212-215 (from which the widths 251-255 are measured) are the channel regions (e.g., the vertically-stacked nano-structures of GAA devices) of the transistors PU-2, PD-2, PG-2, R_PD, and R_PG. Therefore, the widths 251-255 may also be interchangeably referred to as channel widths herein.

To optimize SRAM performance, the width 252 is configured to be greater than the width 251. This is because the R_PD transistor is the transistor doing the reading, whereas the R_PG transistor is mostly serving as a switch. In other words, the transistors R_PD and R_PG have different functionalities and serve purposes. In order to improve reading speed of the SRAM cell 200, it is beneficial to increase the width 252 of the transistor R_PD. On the other hand, increasing the width 251 of the transistor R_PG would not add much (if any) benefit to the reading speed of the SRAM cell 200, and yet it may increase the parasitic capacitance of the read-port 200B and/or the standby leakage of the SRAM cell 200, which would have been undesirable. As such, the width 252 is increased relative to the width 251, in order to simultaneously increase SRAM reading speed and reduce parasitic capacitance and/or leakage. Note that resizing the width 252 means that the width 252 (of the transistor R_PD of the read-port 200B) may also be greater than the width 254 (of the transistor PD-2 of the write-port 200A).

In some embodiments, a ratio of the width 251 and the width 252 is in a range between about 0.65:1 and about 0.9:1, and a ratio of the width 252 and the width 254 is in a range between about 1.1:1 and about 2:1. These ranges are not arbitrarily chosen but rather specifically configured to ensure that the SRAM cell 200 can achieve the reading speed improvement and leakage reduction, without causing undue manufacturing difficulties.

Due to the enlarging of the channel width 252 of the transistor R_PD, the width 252 is also greater than the width 254 of the transistor PD-2, which may not have been enlarged compared to the pull-up transistors of the write-port of conventional SRAM devices. In some embodiments, a ratio of the width 252 and the width 254 is in a range between about 1.1:1 and about 2:1. Such a range is not arbitrarily chosen but rather specifically configured to sufficiently improve the speed of the read-port 200B without increasing the footprint of the overall device or raising electrical shorting risks, or causing undue manufacturing difficulties.

The width 253 of the transistor PG-2 is approximately equal to the width 254 of the transistor PD-2, since they are formed over the same active region 213. In other words, the channel widths of the transistors PD-2 and PG-2 are approximately equal. And although the channel widths of the transistors PD-1 and PG-1 are not specifically illustrated herein for reasons of simplicity, it is understood that they may be approximately equal to each other as well, since they are formed over the same active region 210. One reason for not reducing the channel width of the transistor PG-2 (or PG-1) is that, unlike the transistor R_PG, the transistor PG-2 (or PG-1) is used for both data input (in a write cycle) and data output (in a read cycle). Therefore, it may be beneficial for the channel width of the transistor PG-2 (or PG-1) to be relatively wide, for example as wide as the transistor PD-2 (or PD-1).

In the illustrated embodiment, the width 253 of the transistor PG-2 (or the width 254 of the transistor PD-2) is greater than the width 255 of the transistor PU-2 (or of the transistor PU-1). In other words, the transistor PU-2 (and PU-1) may be resized to have a smaller channel width compared to conventional SRAM devices. This allows for write-port write margin improvement. In some embodiments, a ratio of the width 253 and the width 255 is in a range between about 1.5:1 and about 5:1. Such a range is not arbitrarily chosen but rather specifically configured to allow for sufficient write margin improvement without causing manufacturing difficulties.

Another aspect of the present disclosure involves implementing different work function (WF) metals and/or different gate dielectric materials for different portions of a gate electrode, so as to achieve different threshold voltages for at least some of the different transistors of the two-port SRAM cell 200. For example, the same (and continuous) gate electrode 221 is used for the transistors PU-2, PD-2, and R_PD. However, as discussed above, the write-port 200A and the read-port 200B have different concerns. For example, the write-port 200A may need a bigger current to achieve a faster write speed. As such, the transistors of the write-port 200A may need a higher threshold voltage. In comparison, the read-port 200B does not need such a big current to perform the reading operations, since this would not increase the reading speed much but may lead to undesirable leakage or excessive power consumption. As such, the transistors of the read-port 200B should have a lower threshold voltage compared to the write-port 200A.

In some embodiments, the different threshold voltages may be configured by implementing a first WF metal for the gate electrode of the transistor PD-2, a second WF metal for the gate electrode of the transistor R_PD, and a third WF metal for the gate electrode of the transistor PU-2, even though these transistors "share" an otherwise continuous gate structure 221. In other words, the gate structure 221 has different portions that contain different materials corresponding to the different transistors PU-2, PD-2, and R_PD. It is understood that the transistors PD-1, PG-1, and PG-2 may also be configured to have the first WF metal, the transistor R_PG may be configured to have the second WF metal, and the transistor PU-1 may be configured to have the third WF metal. The different WF metals may be achieved by using different types of WF metal materials, or using different thicknesses of the same type of WF metal materials. For example, the first WF metal may have a thicker WF metal (e.g., TiN or WCN) than the second WF metal in some embodiments.

In some embodiments, the different threshold voltages may also be configured by implementing different gate dielectric materials for the gate structures of different transistors. For example, the gate dielectrics of the transistors R_PD and PD-2 may have different levels of dopants. In some embodiments, the gate dielectric of the transistor R_PD has a lanthanum (La) dopant, while the gate dielectric of the transistor PD-2 does not.

By tuning the gate dielectrics and/or gate electrodes, the R_PD transistor may achieve a lower threshold voltage than the PD-2 transistor, for example by about at least 30 millivolts (mV). Thus, using a combination of different WF metals for the gate electrodes and/or different gate dielectric materials, the transistors PD-1, PD-2, PG-1, and PG-2 may be tuned to have a first threshold voltage level/setting, the transistors R_PD and R_PG may be tuned to have a second threshold voltage level/setting, and the transistors PU-1 and PU-2 may be tuned to have a third threshold voltage level/setting, where the first, second, and third threshold voltage levels/settings are different from each other. Again, achieving different threshold voltage levels/settings helps to increase the writing speed of the write-port 200A and reduce the leakage of the read-port 200B simultaneously.

Figure 4:
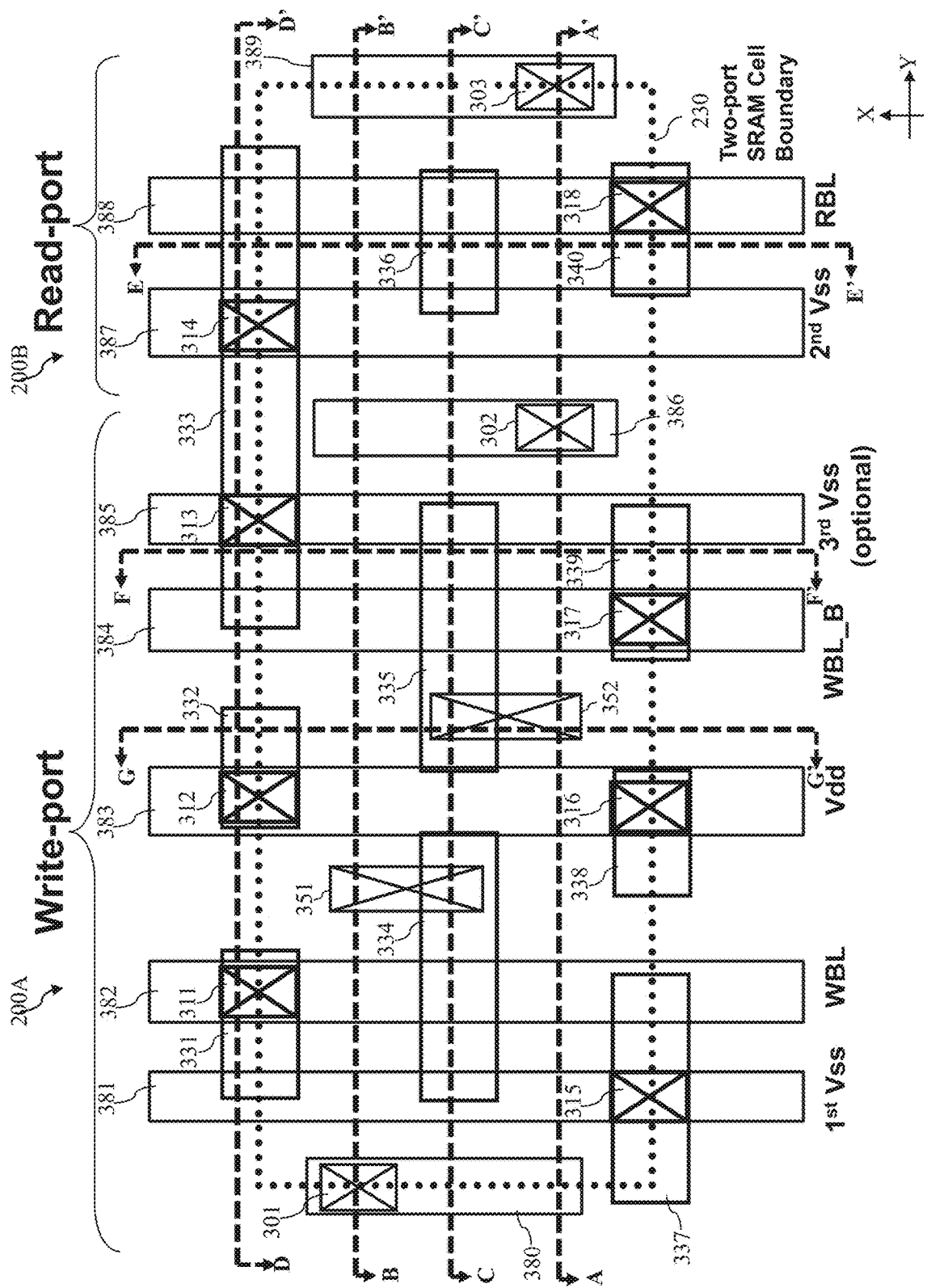

FIG. 4 is another top view of the two-port SRAM cell 200. The elements illustrated in FIG. 3 (such as active regions and gate structures) are omitted from FIG. 4 for reasons of visual clarity and simplicity. Instead, FIG. 4 illustrates various vias, contacts, and metal lines of an interconnect structure that are used to interconnect the various components of the two-port SRAM cell 200.

In more detail, the two-port SRAM cell 200 includes a plurality of gate vias, such as gate vias 301, 302, and 303. The gate via 301 is located on, and provides electrical connectivity to, the gate structure 220 of the transistor PG-1. The gate via 302 is located on, and provides electrical connectivity to, the gate structure 223 of the transistor PG-2. The gate via 303 is located on, and provides electrical connectivity to, the gate structure 224 of the transistor R_PG.

The two-port SRAM cell 200 also includes a plurality of source/drain vias, such as source/drain vias 311-318. The source/drain vias 311-318 are located on, and provides electrical connectivity to, the various source/drain regions of the various transistors of the two-port SRAM cell 200.

The two-port SRAM cell 200 further includes a plurality of contacts 331-340 (also referred to as longer contacts). The contact 331 is a contact for a first bit-line. The contact 332 is a contact for a second Vdd. The contact 333 is a contact for a second Vss. The contact 334 is a contact for a first data node. The contact 335 is a contact for a second data node. The contact 336 is a dummy contact. The contact 337 is a contact for a first Vss. The contact 338 is a contact for a first Vdd. The contact 339 is a contact for a second bit-line. The contact 340 is a contact for a bit-line for the read-port 200B. The two-port SRAM cell 200 also includes butt contacts 351 and 352 (also referred to as butted contacts).

The two-port SRAM cell 200 also includes a plurality of metal lines, for example metal lines 380-389. Some of these metal lines 380-389 may correspond to specific signal lines (or conductors thereof). For example, the metal line 381 corresponds to a $1^{st}$ Vss conductor, the metal line 382 corresponds to a write-port bit-line conductor, the metal line 383 corresponds to a Vdd conductor, the metal line 384 the metal line a write-port bit-line-bar conductor, the metal line 385 corresponds to a $3^{rd}$ Vss (which may be optional) conductor, the metal line 387 corresponds to a $2^{nd}$ Vss conductor, and the metal line 388 corresponds to a read-port bit-line conductor. In some embodiments, these metal lines 380-389 are located in a first level metal layer (e.g., metal-1) of the interconnection structure.

Although not specifically illustrated in FIG. 4 for reasons of simplicity, the interconnection structure may include additional metal lines or landing pads, at least some of which may be implemented in other levels of the interconnection structure. For example, a first write-port word-line landing pad and a first read-port word-line landing pad may be implemented in the first level metal layer. A write-port word-line conductor and a second read-port word-line landing pad may be implemented in a second level metal layer (e.g., metal-2) that is located above the first level metal layer. A third read-port word-line landing pad may be implemented in a third level metal layer (e.g., metal-3) that is located above the second level metal layer. A read-port word-line conductor may be implemented in a fourth level metal layer (e.g., metal-4) that is located above the third level metal layer. It is understood that the routing directions of the metal lines located in the first and third level metal layers are substantially parallel to one another, as are the routing directions of the metal lines located in the second and fourth level metal layers. The routing directions of the metal lines located in the first and third level metal layers are substantially perpendicular to the routing directions of the metal lines located in the second and fourth level metal layers.

Figure 5:
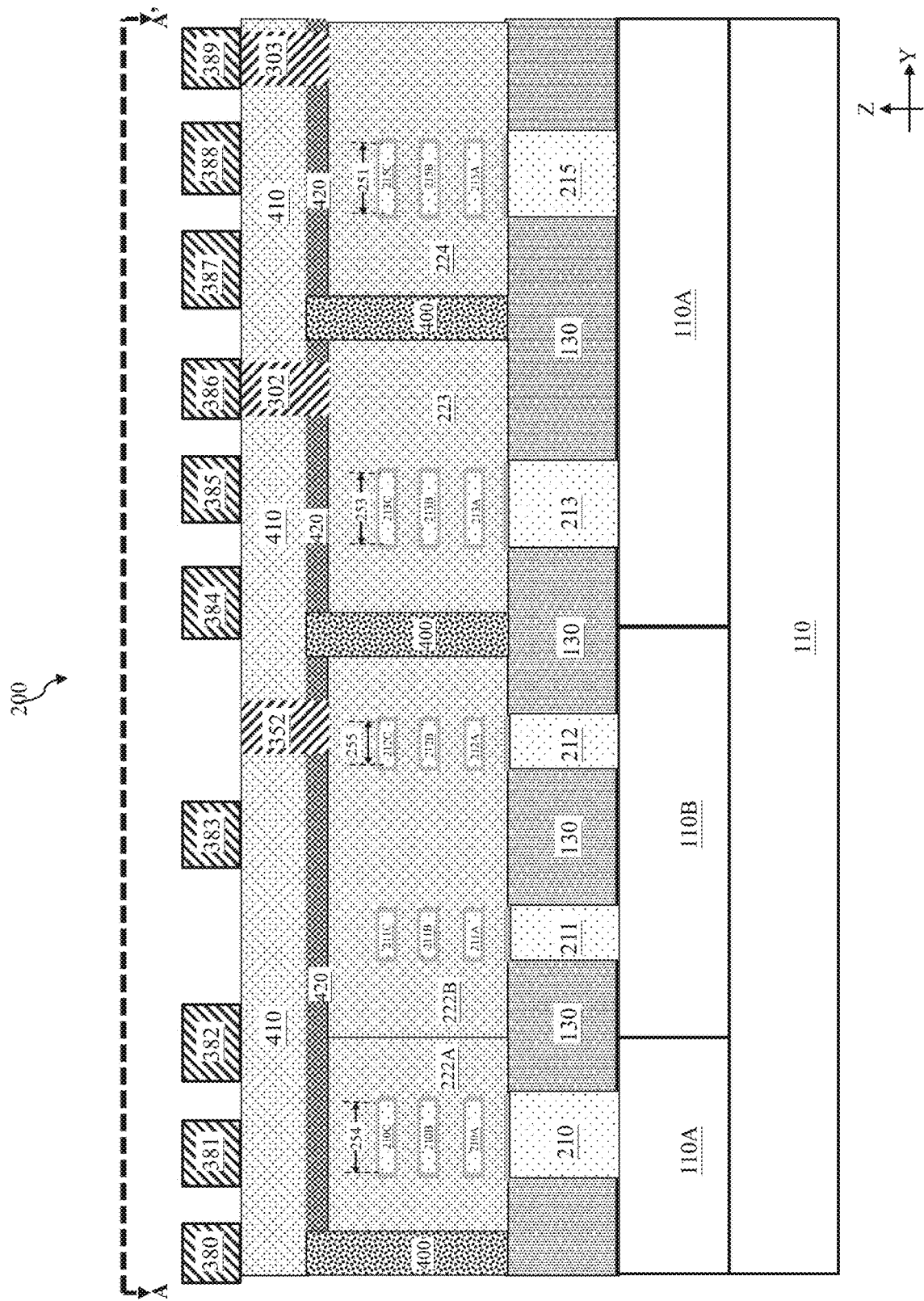
FIGS. 5-11 illustrate cross-sectional side views of a two-port SRAM cell according to an embodiment of the present disclosure.
Figure 6:
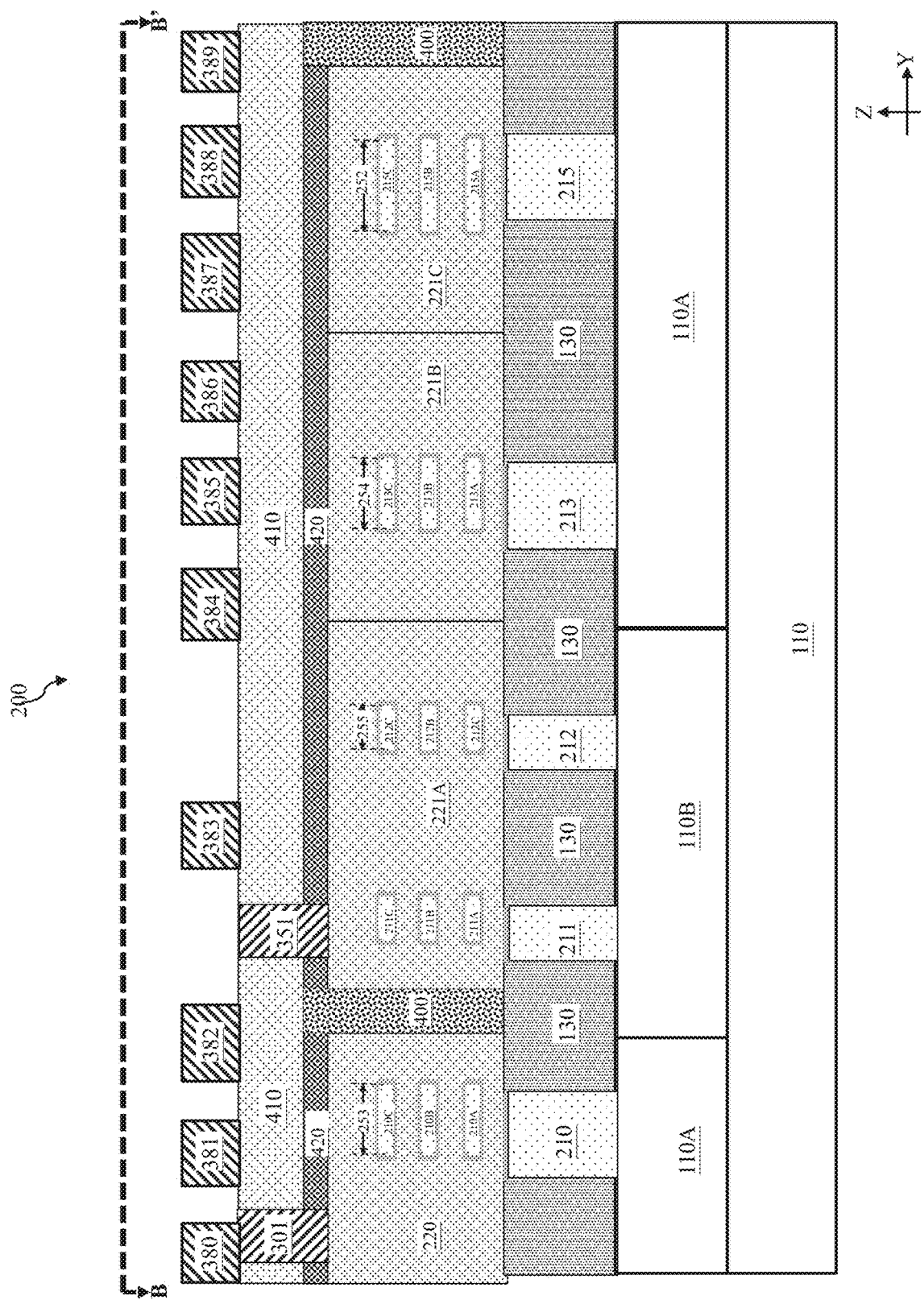
Figure 7:
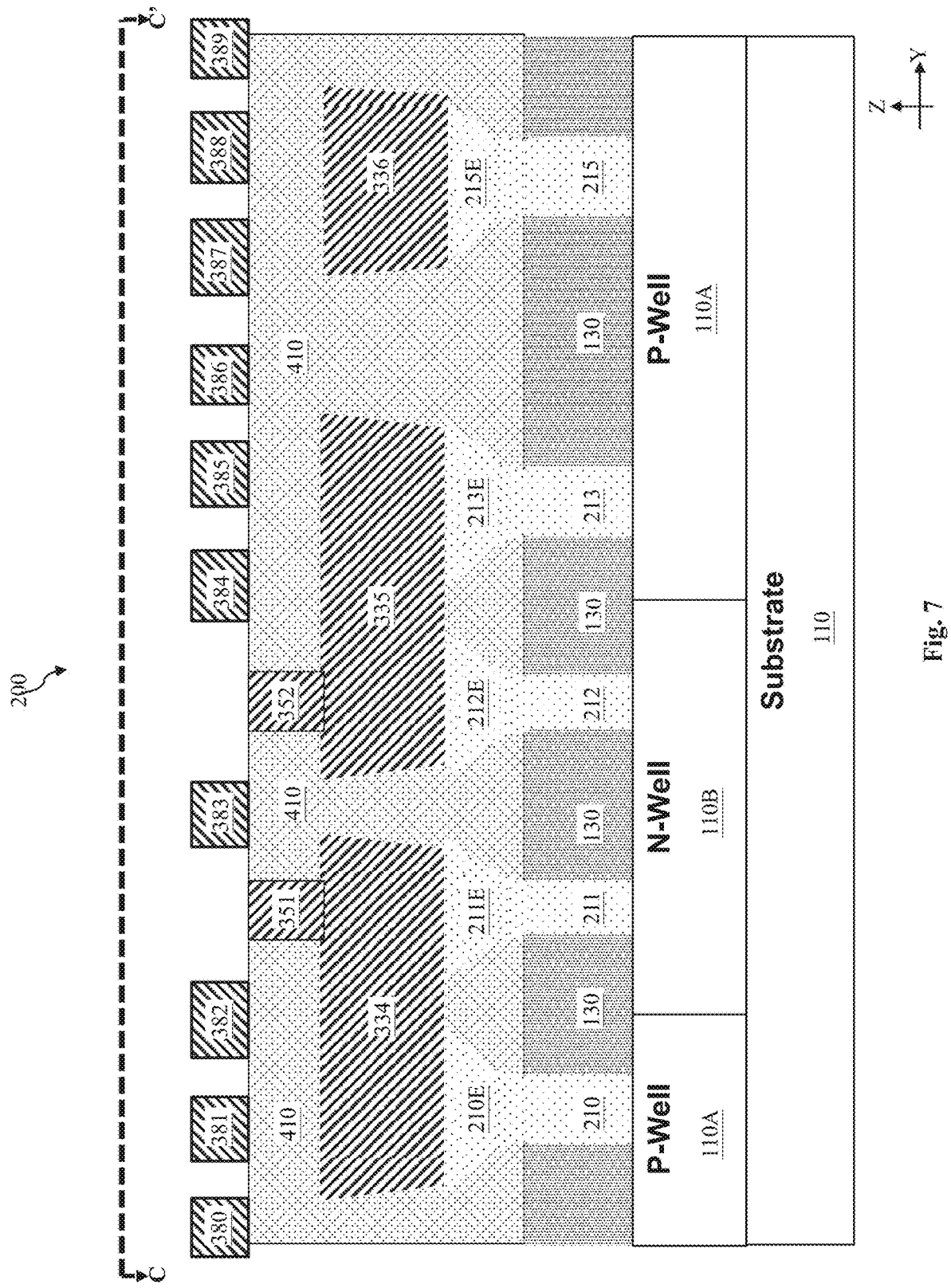
Figure 8:
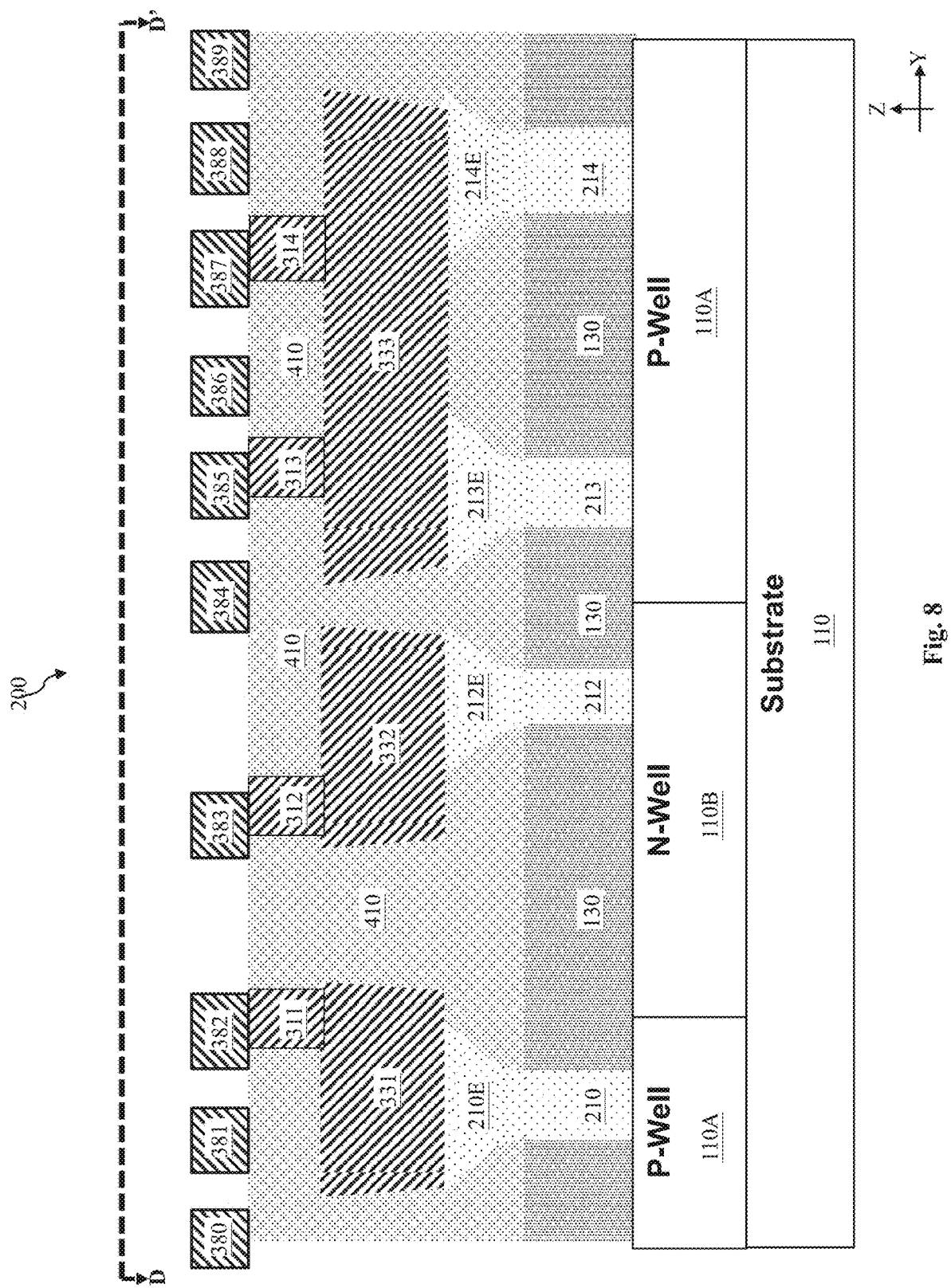
Figure 9:
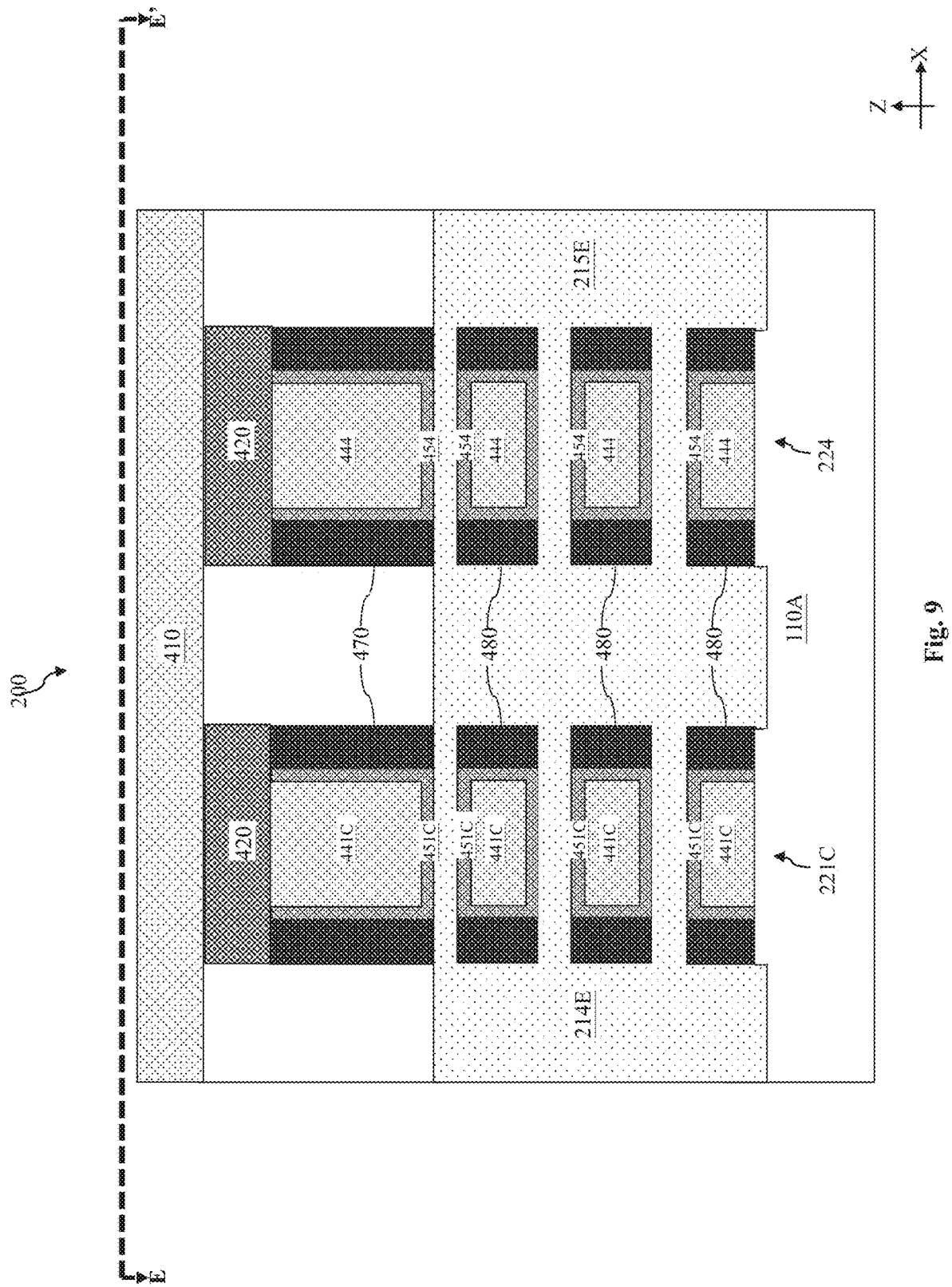
Figure 10:
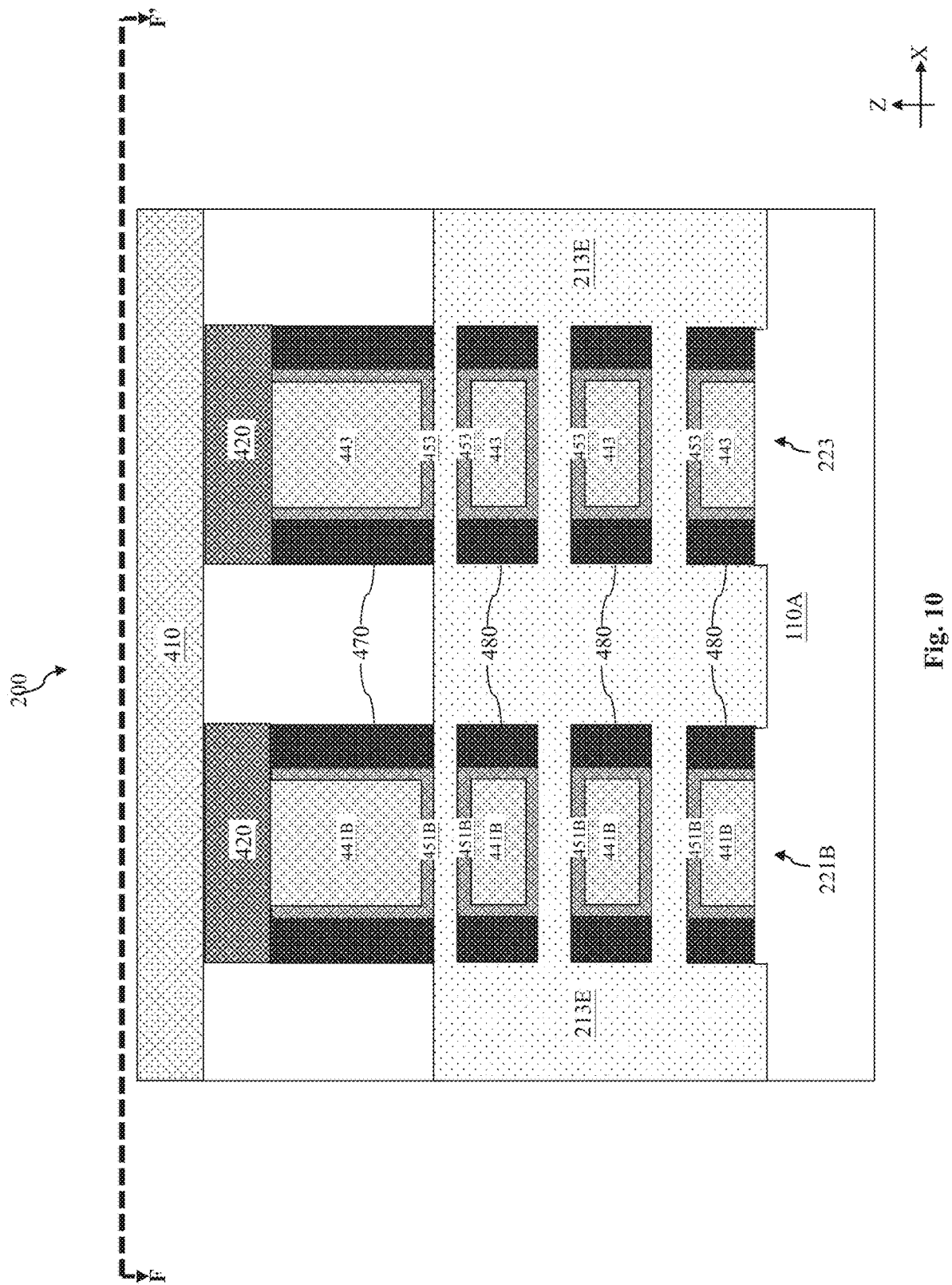
Figure 11:
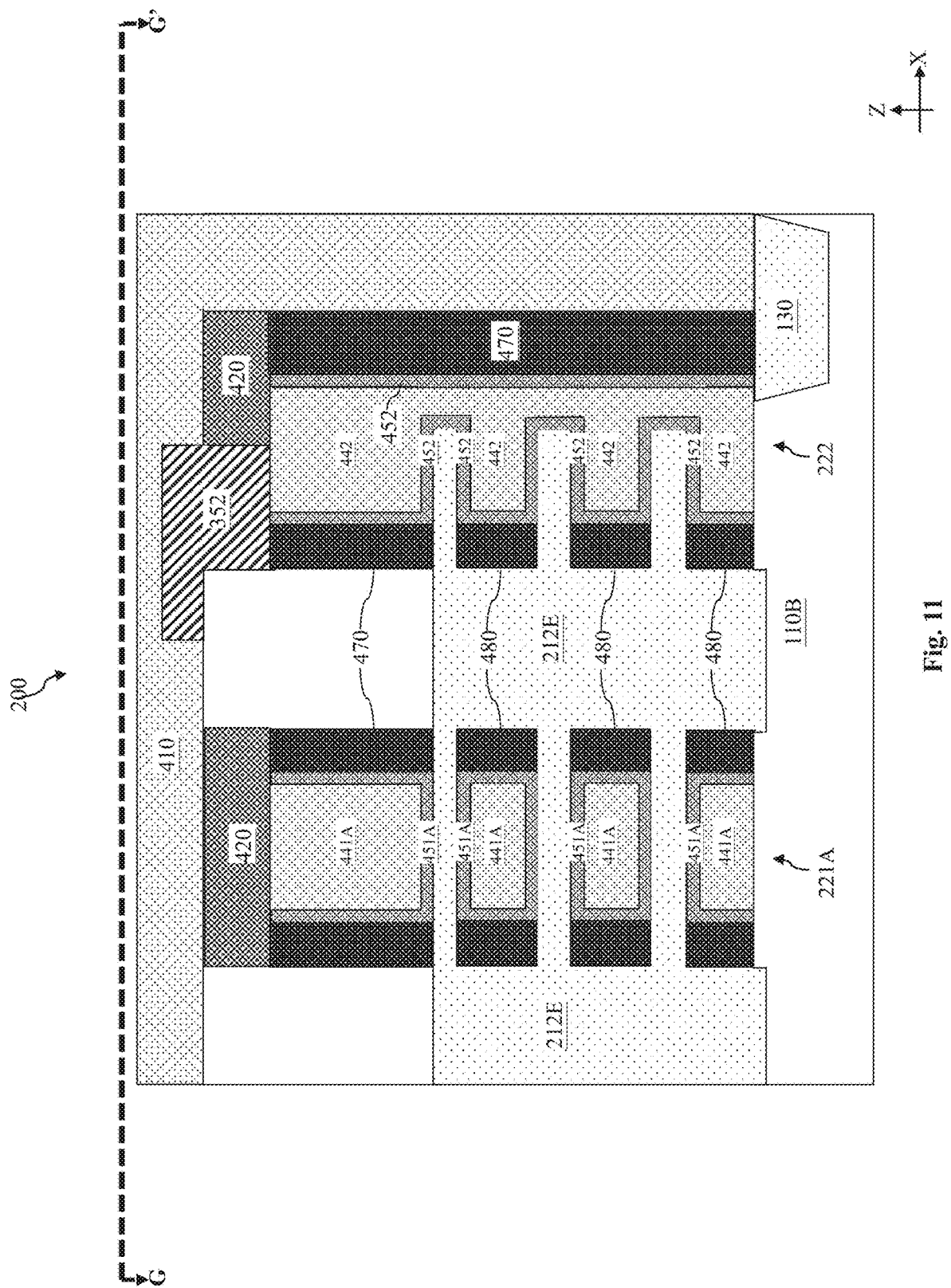

To further illustrate the aspects of the present disclosure discussed above, various cross-sectional views of the two-port SRAM cell 200 are shown in FIGS. 5-11. These cross-sectional views are taken at different cross-sections of the top views of the two-port SRAM cell 200 of FIGS. 3-4. In more detail, FIG. 5 corresponds to a cross-sectional view taken along a cutline A-A' of FIGS. 3-4. FIG. 6 corresponds to a cross-sectional view taken along a cutline B-B' of FIGS. 3-4. FIG. 7 corresponds to a cross-sectional view taken along a cutline C-C' of FIGS. 3-4. FIG. 8 corresponds to a cross-sectional view taken along a cutline D-D' of FIGS. 3-4. FIG. 9 corresponds to a cross-sectional view taken along a cutline E-E' of FIGS. 3-4. FIG. 10 corresponds to a cross-sectional view taken along a cutline F-F' of FIGS. 3-4. FIG. 11 corresponds to a cross-sectional view taken along a cutline G-G' of FIGS. 3-4. The cross-sectional views of FIGS. 5-8 are taken along a Y-Z plane, whereas the cross-sectional views of FIGS. 9-11 are taken along a X-Z plane.

Referring now to FIG. 5, the two-port SRAM cell 200 includes a substrate, P-wells 110A and an N-well 100B formed over the substrate 110 (e.g., by doping the different portions of the substrate 110), and active regions 210-215 formed over the P-well regions 110A and the N-well region 110B. The lower segments (e.g., the fin structures) of the active regions 210-215 are separated from one another in the Y-direction by the isolation structure 130, for example a shallow trench isolation (STI). The upper portions of the active regions 210-215 are implemented as nano-structures 210A-210C, 211A-211C, 212A-212C, 213A-213C, and 215A-215C, respectively, such as nano-sheets, nano-tubes, nano-wires, etc. These nano-structures serve as vertically-stacked conductive channels of their respective transistors. For example, the nano-structures 210A-210C serve as the channels of the transistor PD-1, the nano-structures 211A-211C serve as the channels of the transistor PU-1, the nano-structures 212A-212C serve as the channels of the transistor PU-2, the nano-structures 213A-213C serve as the channels of the transistor PG-2, and the nano-structures 215A-215C serve as the channels of the transistor R_PG. Note that each vertical stack of the gate structures shown in FIG. 5 has three nano-structures (e.g., 210A disposed over 210B, which is disposed over 210C), but this is merely for reasons of simplicity. In other embodiments, each vertical stack of nano-structures may include a different number of nano-structures, for example two, four, or five.

The nano-structures 210A-210C of the transistor PD-1 each have the channel width 254 (same as the channel width of the transistor PD-2 discussed above with reference to FIG. 3). The nano-structures 212A-212C of the transistor PU-1 each have the channel width 255. The nano-structures 213A-213C of the transistor PG-2 each have the channel width 253. The nano-structures 215A-215C of the transistor R_PG each have the channel width 251. These channel widths 254, 255, 253, and 251 are each measured in the Y-direction. As discussed above with reference to FIG. 3, in order to optimize the performance of the two-port SRAM cell 200, the channel width 253 is greater than the channel width 255, for example by about 1.5 time and about 5 times. In comparison, the channel widths 253 and 254 are approximately equal to one another. Meanwhile, the thickness (measured in the Z-direction) of each of the nano-structures 210A-210C, 211A-211C, 212A-212C, 213A-213C, and 215A-215C is approximately equal to one another.

The nano-structures 210A-210C are circumferentially surrounded by the gate structure 222A (as a first portion of the gate structure 222 of the transistor PD-1), and the nano-structures 211A-211C and 212A-212C are circumferentially surrounded by the gate structure 222B (as a second portion of the gate structure 222 of the transistor PD-1). Meanwhile, the nano-structures 213A-213C are circumferentially surrounded by the gate structure 223 of the transistor PG-2, and the nano-structures 215A-215C are circumferentially surrounded by the gate structure 224 of the transistor R_PG. The gate structures 222, 223, and 224 are also isolated from each other by dielectric isolation structures 400.

As discussed above with reference to FIG. 3, another aspect of the present disclosure involves implementing at least some of the gate structures 222A-222B, 223, and 224 with different material compositions. In some embodiments, the gate structure 222A and the gate structure 223 each have a first WF metal, the gate structure 224 has a second WF metal different from the first WF metal, and the gate structure 222B has a third WF metal different from the first WF metal and different from the second WF metal. In some embodiments, the first WF metal and the second WF metal each contains TiN, TaN, WCN, TiAl, W, or combinations thereof. However, the first WF metal has a thicker TiN and/or a thicker WCN than the second WF metal. The implementation of different WF metals for different gate structures allows for different threshold voltages (Vt) to be tuned for these different gate structures. This facilitates further optimization of the SRAM performance, since it allows the writing speed of the write-port 200A to be increased while reducing (or at least not increasing) the leakage of the read-port 200B.

Gate vias 302 and 303 are formed over the gate structures 223 and 224, respectively. The butted contact 352 is formed over the gate structure 222B. As discussed above with reference to FIG. 4, the gate vias 302-303 and the butted contact 352 help provide electrical connectivity between the gate structures 222-224 and other components of the two-port SRAM cell 200 and/or with external devices.

The gate vias 302-303 and the butted contact 352 are electrically and physically separated from one another by an interlayer dielectric (ILD) 410, which is formed over the gate structures 222-224. Note that in some embodiments, such as in the embodiment illustrated herein, a gate-top dielectric layer 420 may be formed over the gate structures 222-224. In that case, ILD 410 may be formed over the gate-top dielectric layer 420. The metal lines 380-389 (some of which correspond to Vss, write-port BL, Vdd, write-port BLB, and read-port BL) are formed over the ILD 410.

Referring now to FIG. 6, the cross-sectional view (corresponding to the cutline B-B') shown herein shares various similarities with the cross-sectional view of FIG. 5 discussed above. Therefore, similar components appearing in FIG. 5-6 will be labeled the same, and their detailed discussions may not be repeated hereinafter.

Unlike FIG. 5, FIG. 6 illustrates the cross-sections of: the gate structure 220 (of the transistor PG-1), the gate structure 221A (of the transistor PU-2), the gate structure 221B (of the transistor PD-2), and the gate structure 221C (of the transistor R_PD), where the gate structures 221A, 221B, and 221C are different portions of the same gate structure 221 shown in FIG. 3. The nano-structures 210A-210C are each circumferentially surrounded by the gate structure 220. The nano-structures 211A-211C and 212A-212C are each circumferentially surrounded by the gate structure 221A. The nano-structures 213A-213C are each circumferentially surrounded by the gate structure 221B. The nano-structures 215A-215C are each circumferentially surrounded by the gate structure 221C. As discussed above, it can be seen that the nano-structures 210A-210C are each wider than the nano-structures 212A-212C, since the channel width 253 is wider than the channel width 255 by about 1.5 times to about 5 times.

The gate via 301 is formed on the gate structure 220, and the butted contact 351 is formed on the gate structure 221A. The ILD 410 provides electrical and physical separation between the gate via 301 and the butted contact 351. The metal lines 380-389 are formed over the ILD 410.

Referring now to FIG. 7, the cross-sectional view (corresponding to the cutline C-C') shown herein shares various similarities with the cross-sectional view of FIGS. 5-6 discussed above. Therefore, similar components appearing in FIG. 5-7 will be labeled the same, and their detailed discussions may not be repeated hereinafter.

Unlike FIGS. 5-6, the cutline C-C' of FIG. 7 is taken outside the gate structures and do not intersect the nano-structures (i.e., the channels of GAA transistors). Instead, the cutline C-C' intersects a plurality of source/drain components 210E-215E that are epitaxially grown on the active regions 210-215, respectively. The source/drain components 210E, 213E, and 215E are N-type source/drain components, while the source/drain components 211E and 212E are P-type source/drain components. The source/drain components 210E-215E are also electrically and physically separated from one another by the ILD 410.

The contact 334 is formed over, and electrically couples together, the source/drain components 210E and 211E. The contact 335 is formed over, and electrically couples together, the source/drain components 212E and 213E. The dummy contact 336 is formed over the source/drain component 215E. The butted contacts 351 and 352 are formed on the contacts 334 and 335, respectively. The metal lines 380-389 are formed over the ILD 410.

Referring now to FIG. 8, the cross-sectional view (corresponding to the cutline D-D') shown herein shares various similarities with the cross-sectional view of FIGS. 5-7 discussed above. Therefore, similar components appearing in FIG. 5-8 will be labeled the same, and their detailed discussions may not be repeated hereinafter.

The cutline D-D' of FIG. 8 is also taken outside the gate structures and do not intersect the nano-structures (i.e., the channels of GAA transistors). Instead, the cutline D-D' intersects the source/drain components 210E, 212E, 213E, and 214E that are epitaxially grown on the active regions 210, 212, 213, and 214, respectively. The source/drain components 210E, 213E, and 214E are N-type source/drain components, while the source/drain component 212E is a P-type source/drain component.

The contact 331 is formed over the source/drain component 210E. The contact 332 is formed over the source/drain component 212E. The contact 333 is formed over, and electrically couples together, the source/drain components 213E and 214E. The source/drain vias 311, 312, and 313-314 are formed on the contacts 331, 332, and 333, respectively. The metal lines 380-389 are formed over the ILD 410.

Referring now to FIG. 9, the cross-sectional view (corresponding to the cutline E-E') is taken in a direction that is perpendicular to the cross-sectional views of FIGS. 5-8. In this view, the gate structure 221C (of the transistor R_PD) and the gate structure 224 (of the transistor R_PG) are shown as being formed over the P-well 110A. The gate structure 221C includes a plurality of gate electrode components 441C and a plurality of gate dielectric components 451C. The gate structure 224 includes a plurality of gate electrode components 444 and a plurality of gate dielectric components 454. The gate dielectric components 451C at least partially surround or wrap around the gate electrode components 441C. The gate dielectric components 454 at least partially surround or wrap around the gate electrode components 444. As discussed above, the gate electrode components 441C and 444 each have the second WF metal. Also as discussed above, the gate dielectric components 451C and/or the gate dielectric components 454 may include a lanthanum dopant to help tune the threshold voltage of their respective transistors.

Source/drain components 214E are disposed on opposite sides of the gate structure 221C, and source/drain components 215E are disposed on opposite sides of the gate structure 224. Top gate spacers 470 are also formed on the sidewalls of the portion of the gate structures 221C and 224 above the upper surfaces of source/drain components 214E and 215E. Inner spacers 480 are formed on portions of the gate structures 221C and 224 below the upper surfaces of source/drain components 214E and 215E. The gate top dielectric layer 420 is formed above the gate structures 441C and 444. The ILD 410 is formed above the gate top dielectric layer 420.

Referring now to FIG. 10, the cross-sectional view shown corresponds to the cutline F-F', which is parallel to the cutline E-E' of FIG. 9. FIG. 10 shares various similarities with the cross-sectional view of FIG. 9 discussed above. Therefore, similar components appearing in FIGS. 9-10 will be labeled the same, and their detailed discussions may not be repeated hereinafter.

As shown in FIG. 10, the gate structure 221B (of the transistor PD-2) and the gate structure 223 (of the transistor PG-2) are shown as being formed over the P-well 110A. The gate structure 221B includes a plurality of gate electrode components 441B and a plurality of gate dielectric components 451B. The gate structure 223 includes a plurality of gate electrode components 443 and a plurality of gate dielectric components 453. The gate dielectric components 451B at least partially surround or wrap around the gate electrode components 441B. The gate dielectric components 453 at least partially surround or wrap around the gate electrode components 443. As discussed above, the gate electrode components 441B and 443 each have the first WF metal. Also as discussed above, the gate dielectric components 451B and/or the gate dielectric components 453 do not include the lanthanum dopant to help tune the threshold voltage of their respective transistors.

Source/drain components 213E are disposed on opposite sides of the gate structure 221B and on opposite sides of the gate structure 223. The top gate spacers 470 and inner spacers 480 are formed in a manner similar to that shown in FIG. 9, as are the gate top dielectric layer 420 and ILD 410.

Referring now to FIG. 11, the cross-sectional view shown corresponds to the cutline G-G', which is also parallel to the cutline E-E' of FIG. 9. FIG. 11 shares various similarities with the cross-sectional view of FIG. 9 discussed above. Therefore, similar components appearing in FIGS. 9-11 will be labeled the same, and their detailed discussions may not be repeated hereinafter.

As shown in FIG. 11, the gate structure 221A (of the transistor PU-2) and the gate structure 222 (of the transistor PU-1) are shown as being formed over the N-well 110B. The gate structure 221A includes a plurality of gate electrode components 441A and a plurality of gate dielectric components 451A. The gate structure 222 includes a plurality of gate electrode components 442 and a plurality of gate dielectric components 452. The gate dielectric components 451A at least partially surround or wrap around the gate electrode components 441A. The gate dielectric components 452 at least partially surround or wrap around the gate electrode components 442. As discussed above, the gate electrode components 441A and 442 each have the third WF metal.

Source/drain components 212E are disposed on opposite sides of the gate structure 221A and on a "left" side of the gate structure 222. The top gate spacers 470 and inner spacers 480 are formed in a manner similar to that shown in FIG. 9, as are the gate top dielectric layer 420 and ILD 410. One difference is that the gate electrode components 442 merge into one another vertically, and the dielectric layer 452 and the top spacer 470 to the "right" side of the gate electrode component 442 extends continuously vertically. The butted contact 352 is formed partially over the gate electrode component 442. One of the isolation structures 130 is disposed partially below the gate structure 222.

Figure 12:
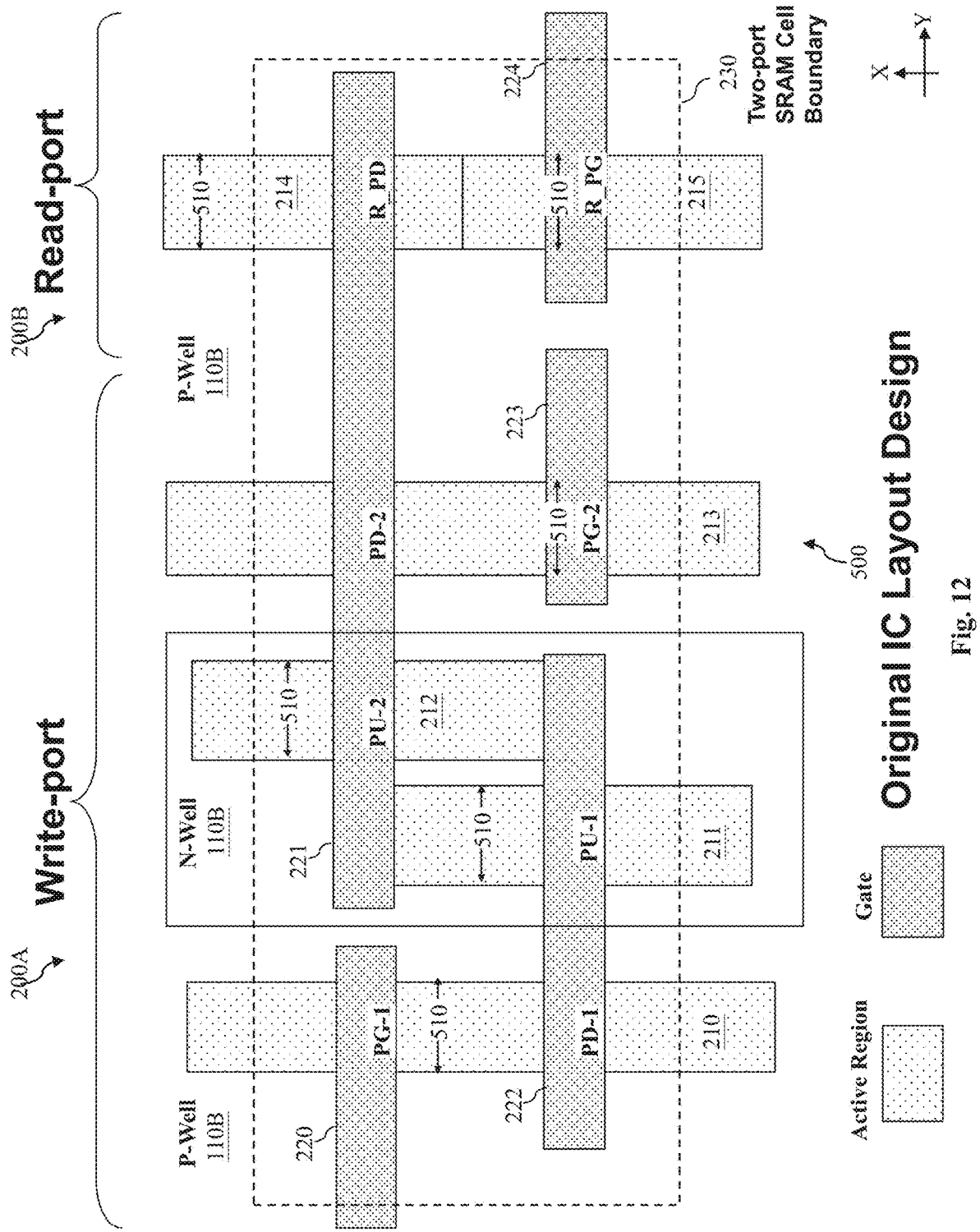
FIG. 12 illustrates a top view of an original IC layout design according to an embodiment of the present disclosure.
Figure 13:
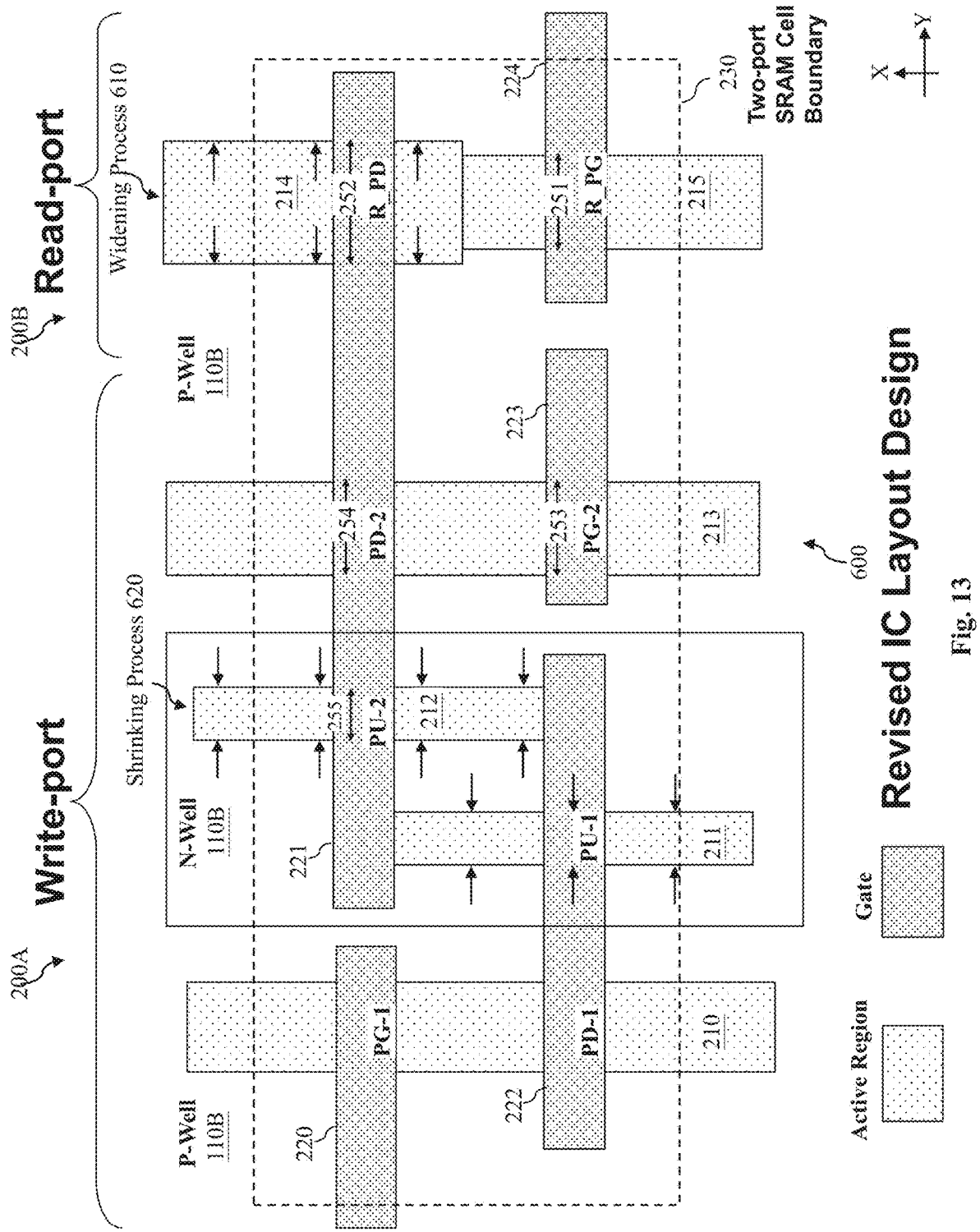
FIG. 13 illustrates a top view of a revised IC layout design according to an embodiment of the present disclosure.

FIGS. 12-13 illustrate a process in which an original IC layout design is revised to generate a new layout design according to various aspects of the present disclosure. In more detail, FIG. 12 represents a top view of a portion of an original layout design 500 of a two-port SRAM cell, and FIG. 13 represents a top view of a portion of a revised (new) layout design 600 of the two-port SRAM cell. For reasons of simplicity, the components shown in FIGS. 12-13 are labeled the same as those appearing in FIG. 3.

In some embodiments, the original IC layout design 500 may be received from (or generated by) an IC design house. As shown in FIG. 12, the original IC layout design 500 includes the write-port 200A and the read-port 200B. The write-port 200A includes the transistors PG-1, PG-2, PU-1, PU-2, PD-1, and PD-2, where these transistors include various portions of the active regions 210-213 and the gate structures 220-223 formed over the active regions 210-213. The read-port 200B includes the transistors R_PD and R_PG, where these transistors include various portions of the active regions 214-215 and the gate structures 221 and 224 formed over the active regions 214-215. In some embodiments, the active regions 214-215 may be portions of the same active region. In the original layout design, the various active regions 210-215 may have substantially same widths 510 measured in the Y-direction. In other words, each of the active regions 210-215 may be about as wide as any of the other active regions 210-215. In other embodiments, the transistors R_PD and R_PG of the read-port 200B may have slightly different widths than the transistors PG-1, PG-2, PD-1, PD-2, PU-1, and PU-2 of the write-port 200A in the original IC layout design 500.

In some embodiments, a chip foundry may receive the original IC layout design 500, and the chip foundry may revise the original IC layout design 500 to generate the revised IC layout design 600 shown in FIG. 13. The revised IC layout design 600 may be generated by performing a widening process 610 (in the Y-direction) to the active region 214, so that the widened active region 214 can achieve the width 252, which is wider than the width 251 and wider than the width 253 or 254. The revised layout design 600 may also be generated by performing a shrinking process 620 (in the Y-direction) to the active region 211 and to the active region 212, so that the shrunken active regions 211-212 can each achieve the width 255, which is narrower than the width 253 or 254. In some embodiments, the active region R_PG may also be widened in the Y-direction, though not as much as the active region R_PD. In some embodiments, the widths of the active regions 213 and 210 may remain substantially the same in the revised IC layout design 600 as they were in the original IC layout design 500. In other words, the widths 253-254 shown in FIG. 12 may be substantially equal to the width 510 shown in FIG. 13.

Thereafter, an IC device (e.g., a two-port SRAM device) may be fabricated using the revised IC layout design 600. As discussed above, the resizing of the various active regions herein may help to optimize the performance of the two-port SRAM device, for example by increasing reading and/or writing speed while reducing parasitic capacitance or leakage.

Figure 14:
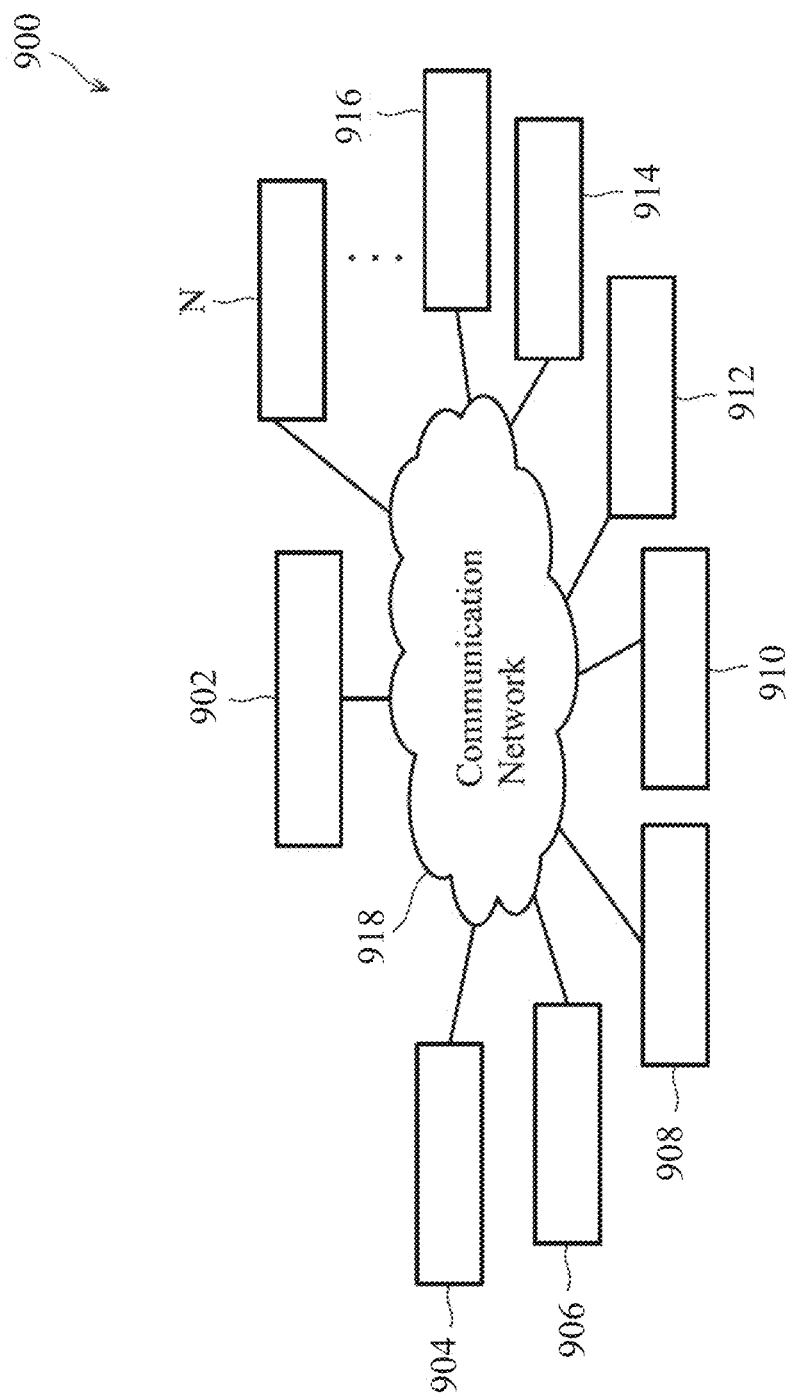
FIG. 14 illustrates an integrated circuit fabrication system according to an embodiment of the present disclosure.

FIG. 14 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 15:
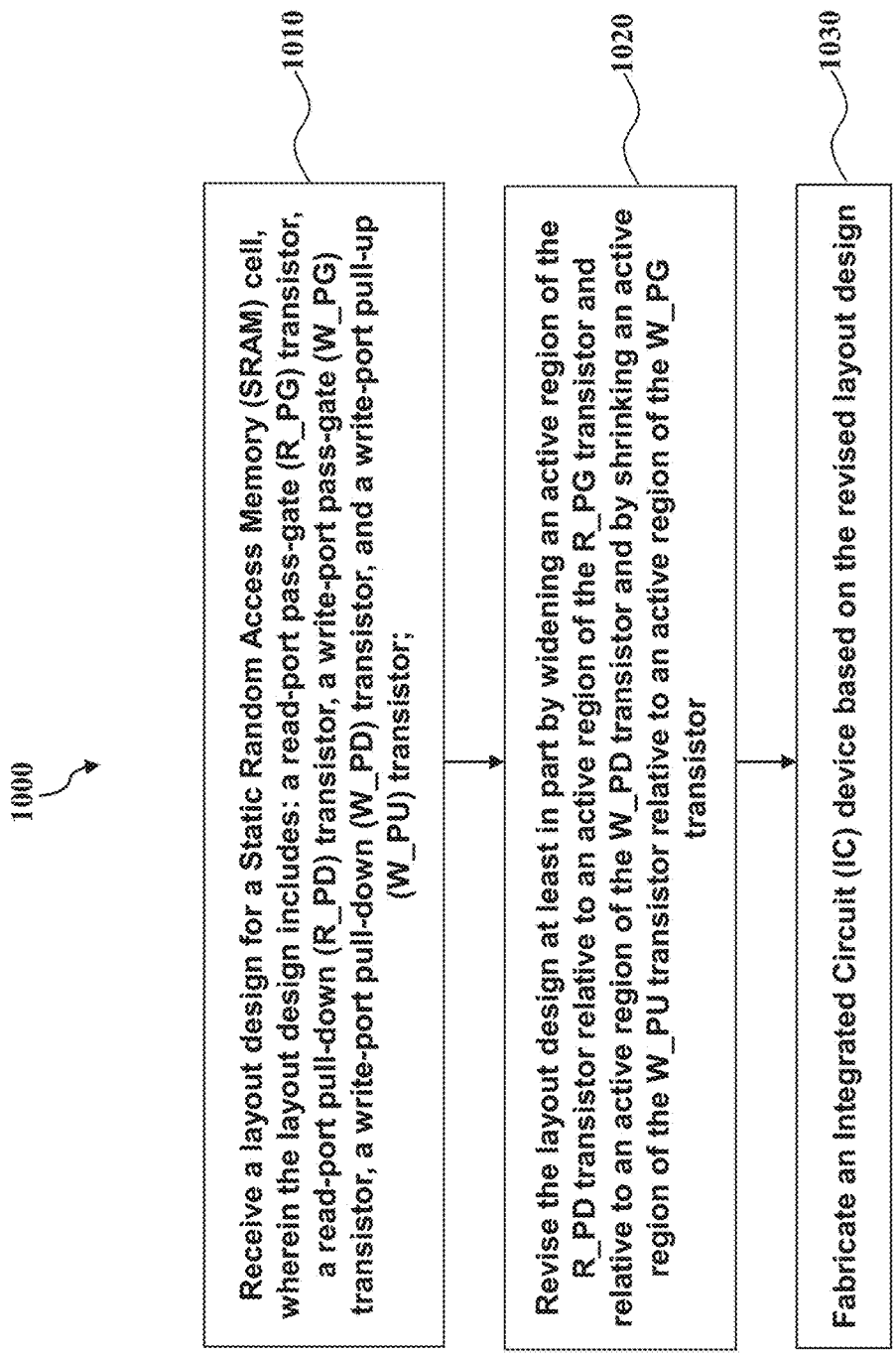
FIG. 15 is a flowchart illustrating a method of fabricating a semiconductor device according to various aspects of the present disclosure.

FIG. 15 is a flowchart illustrating a method 1000 of fabricating a semiconductor device. The method 1000 includes a step 1010 to receive a layout design for a Static Random Access Memory (SRAM) cell. The layout design includes: a read-port pass-gate (R_PG) transistor, a read-port pull-down (R_PD) transistor, a write-port pass-gate (W_PG) transistor, a write-port pull-down (W_PD) transistor, and a write-port pull-up (W_PU) transistor.

The method 1000 includes a step 1020 to revise the layout design at least in part by widening an active region of the R_PD transistor relative to an active region of the R_PG transistor and relative to an active region of the W_PD transistor and by shrinking an active region of the W_PU transistor relative to an active region of the W_PG transistor.

The method 1000 includes a step 1030 to fabricate an Integrated Circuit (IC) device based on the revised layout design. In some embodiments, the fabricating the IC device includes implementing the R_PG transistor, the R_PD transistor, the W_PG transistor, the W_PD transistor, and the W_PU transistor with gate-all-around (GAA) devices.

It is understood that additional steps may be performed before, during, or after the steps 1010-1030. For reasons of simplicity, these additional steps are not discussed in detail herein.

In summary, the present disclosure involves implementing a two-port SRAM device with gate-all-around (GAA) transistors, and to use different channel widths for the different transistors. For example, the pull-down transistor of the read-port of the SRAM device may be configured to have a greater channel width than the pass-gate transistor of the read-port. The pull-down transistor of the read-port of the SRAM device may also be configured to have a greater channel width than the pull-down transistor of the write-port of the SRAM device. The pull-up transistor of the write-port may be configured to have a smaller channel width than the pull-down transistor and the pass-gate transistor of the write-port. The present disclosure also configures the threshold voltage settings differently for some of the different transistors of the SRAM device. For example, a threshold voltage of the pull-down transistor of the read-port may be configured to be lower than a threshold voltage of the pull-down transistor of the read-port.

These configurations of the present disclosure offer advantages over conventional devices. It is understood, however, that no particular advantage is required, other embodiments may offer different advantages, and that not all advantages are necessarily disclosed herein. One advantage is the flexibility in channel width tuning via the implementation of GAA devices. The GAA devices also provide lower standby leakage and better swing performance compared to planar transistors or FinFET transistors. Another advantage is faster speed and reduced leakage. For example, by configuring the channel width of the pull-down transistor of the read-port to be greater than the channel width of the pass-gate transistor of the read-port, the reading speed of the SRAM may be improved, while leakage is reduced. As another example, by configuring the channel width of the pull-down transistor of the read-port to be greater than the channel width of the pull-down transistor of the write-port, the writing speed of the SRAM may also be improved while reducing leakage or parasitic capacitance. The differently configured threshold voltage settings between the pull-down transistors of the write-port and read-port further increase the speed of the SRAM while reducing leakage. Other advantages may include ease of fabrication and compatibility with existing fabrication processes.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure involves a semiconductor device. The semiconductor device includes a first transistor of a read-port of a Static Random Access Memory (SRAM) cell. The first transistor has a first channel width. The semiconductor device includes a second transistor of the read-port of the SRAM cell. The second transistor has a second channel width that is different from the first channel width.

Another aspect of the present disclosure involves a semiconductor device. A read-port of a Static Random Access Memory (SRAM) cell includes a read-port pass-gate (R_PG) transistor and a read-port pull-down (R_PD) transistor. A write-port of the SRAM cell port includes at least a write-port pass-gate (W_PG) transistor, a write-port pull-down (W_PD) transistor, and a write-port pull-up (W_PU) transistor. The R_PG transistor, the R_PD transistor, the W_PG transistor, the W_PD transistor, and the W_PU transistor are gate-all-around (GAA) transistors. The R_PG transistor has a first channel width. The R_PD transistor has a second channel width. The W_PG transistor has a third channel width. The W_PD transistor has a fourth channel width. The W_PU transistor has a fifth channel width. The first channel width and the fourth channel width are each smaller than the second channel width. The third channel width is greater than the fifth channel width.

Yet another aspect of the present disclosure involves a method. According to the method, a layout design for a Static Random Access Memory (SRAM) cell is received. The layout design includes: a read-port pass-gate (R_PG) transistor, a read-port pull-down (R_PD) transistor, a write-port pass-gate (W_PG) transistor, a write-port pull-down (W_PD) transistor, and a write-port pull-up (W_PU) transistor. The layout design is revised at least in part by widening an active region of the R_PD transistor relative to an active region of the R_PG transistor and relative to an active region of the W_PD transistor.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
a first transistor of a read-port of a Static Random Access Memory (SRAM) cell, wherein the first transistor has a first channel width; and
a second transistor of the read-port of the SRAM cell, wherein the second transistor has a second channel width that is different from the first channel width;
wherein the first transistor and the second transistor are gate-all-around (GAA) transistors.

2. The semiconductor device of claim 1, wherein:
the first transistor is a pass-gate (PG) transistor of the read-port of the SRAM cell;
the second transistor is a pull-down (PD) transistor of the read-port of the SRAM cell; and
the first channel width is smaller than the second channel width.

3. The semiconductor device of claim 1, wherein:
the first transistor has a first active region;
the second transistor has a second active region; and
the first active region borders the second active region.

4. The semiconductor device of claim 1, further comprising:
a third transistor of a read-port of the SRAM cell, wherein the third transistor has a third channel width;
a fourth transistor of a read-port of the SRAM cell, wherein the third transistor has a fourth channel width that is smaller than the second channel width; and
a fifth transistor of a read-port of the SRAM cell, wherein the fifth transistor has a fifth channel width that is smaller than the third channel width.

5. The semiconductor device of claim 4, wherein the third channel width is substantially equal to the fourth channel width.

6. The semiconductor device of claim 4, wherein:
the third transistor is a pass-gate (PG) transistor of a write-port of the SRAM cell;
the fourth transistor is a pull-down (PD) transistor of the write-port of the SRAM cell; and
the fifth transistor is a pull-up (PU) transistor of the write-port of the SRAM cell.

7. The semiconductor device of claim 4, wherein the second transistor, the fourth transistor, and the fifth transistor are coupled to one another through a continuous gate structure.

8. The semiconductor device of claim 4, wherein:
the fourth transistor includes a first gate electrode that contains a first work function (WF) metal;
the second transistor includes a second gate electrode that contains a second WF metal; and
the first WF metal is different from the second WF metal.

9. The semiconductor device of claim 8, wherein the first WF metal is thicker than the second WF metal.

10. The semiconductor device of claim 4, wherein:
the fourth transistor includes a first gate dielectric;
the second transistor includes a second gate dielectric; and
the second gate dielectric, but not the first gate dielectric, is doped with a lanthanum dopant.

11. The semiconductor device of claim 1, further comprising a third transistor of a write-port of the SRAM cell, wherein the third transistor has a third channel width that is different from the first channel width or from the second channel width.

12. A semiconductor device, comprising:
a read-port of a Static Random Access Memory (SRAM) cell, wherein the read-port includes a read-port pass-gate (RPG) transistor and a read-port pull-down (RPD) transistor; and
a write-port of the SRAM cell, wherein the write-port includes at least a write-port pass-gate (WPG) transistor, a write-port pull-down (WPD) transistor, and a write-port pull-up (WPU) transistor;
wherein:
the R_PG transistor, the R_PD transistor, the W_PG transistor, the W_PD transistor, and the W_PU transistor are gate-all-around (GAA) transistors;
the R_PG transistor has a first channel width;
the R_PD transistor has a second channel width;
the W_PG transistor has a third channel width;
the W_PD transistor has a fourth channel width;
the W_PU transistor has a fifth channel width;
the first channel width and the fourth channel width are each smaller than the second channel width; and
the third channel width is greater than the fifth channel width.

13. The semiconductor device of claim 12, wherein the R_PD transistor, the W_PD transistor, and the W_PU transistor are electrically coupled together through a continuous gate structure.

14. The semiconductor device of claim 12, wherein a first active region of the R_PG transistor borders a second active region of the R_PD transistor.

15. The semiconductor device of claim 12, wherein the R_PD transistor and the W_PD transistor have different work function (WF) metals.

16. The semiconductor device of claim 12, wherein:
a gate dielectric of the R_PD transistor is doped with lanthanum; and
a gate dielectric of the W_PD transistor is free of being doped with lanthanum.

17. A method, comprising:
receiving a layout design for a Static Random Access Memory (SRAM) cell, wherein the layout design includes: a read-port pass-gate (RPG) transistor, a read-port pull-down (RPD) transistor, a write-port pass-gate (WPG) transistor, a write-port pull-down (WPD) transistor, and a write-port pull-up (WPU) transistor, wherein the R_PG transistor, the R_PD transistor, the W_PG transistor, the W_PD transistor, and the W_PU transistor are gate-all-around (GAA) devices; and
revising the layout design at least in part by widening an active region of the R_PD transistor relative to an active region of the R_PG transistor and relative to an active region of the W_PD transistor.

18. The method of claim 17, further comprising: fabricating an Integrated Circuit (IC) device based on the revised layout design.

19. The method of claim 18, wherein the active region of the R_PD transistor is widened such that:
a first ratio between a width of the active region of the R_PG transistor and a width of the active region of the R_PD transistor is in a range between about 0.65:1 and about 0.9:1; and
a second ratio between the width of the active region of the R_PD transistor and a width of the active region of the W_PD transistor is in a range between about 1.1:1 and about 2:1.

20. The method of claim 17, wherein the revising the layout design further comprises shrinking an active region of the W_PU transistor relative to an active region of the W_PG transistor.

* * * * *